(12) United States Patent
Shen

(10) Patent No.: US 8,068,177 B2
(45) Date of Patent: Nov. 29, 2011

(54) METHODS AND DEVICES FOR SIGNAL SYNCHRONIZATION

(75) Inventor: Chung-Li Shen, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 1430 days.

(21) Appl. No.: 11/469,958

(22) Filed: Sep. 5, 2006

(65) Prior Publication Data

US 2007/0152996 A1    Jul. 5, 2007

(30) Foreign Application Priority Data

Jan. 3, 2006 (TW) ............................ 95100205 A
Apr. 10, 2006 (TW) ............................ 95112625 A

(51) Int. Cl.
*H03L 7/00* (2006.01)

(52) U.S. Cl. .................... 348/540; 348/547; 348/537

(58) Field of Classification Search .......... 348/497–499, 348/510, 512, 514, 515, 518, 519, 563–568; 327/141–163; 375/354–376
See application file for complete search history.

(56) References Cited

U.S. PATENT DOCUMENTS

| 5,150,210 | A | * | 9/1992 | Hoshi et al. ............... 375/240.14 |
| 5,289,508 | A | * | 2/1994 | Wada et al. ................... 375/376 |
| 5,539,473 | A | * | 7/1996 | Kommrusch et al. ......... 348/537 |
| 6,212,208 | B1 | * | 4/2001 | Yoneda et al. ................ 370/538 |

* cited by examiner

*Primary Examiner* — Michael Lee
(74) *Attorney, Agent, or Firm* — Winston Hsu; Scott Margo

(57) ABSTRACT

A signal synchronization device and signal synchronization method are provided. The method comprises determining whether a receiving device can receive data output from an output device synchronously and adjusting the dummy period of the signal, which will be received by the receiving device, when the data output from the output device cannot be received by the receiving device synchronously.

33 Claims, 25 Drawing Sheets

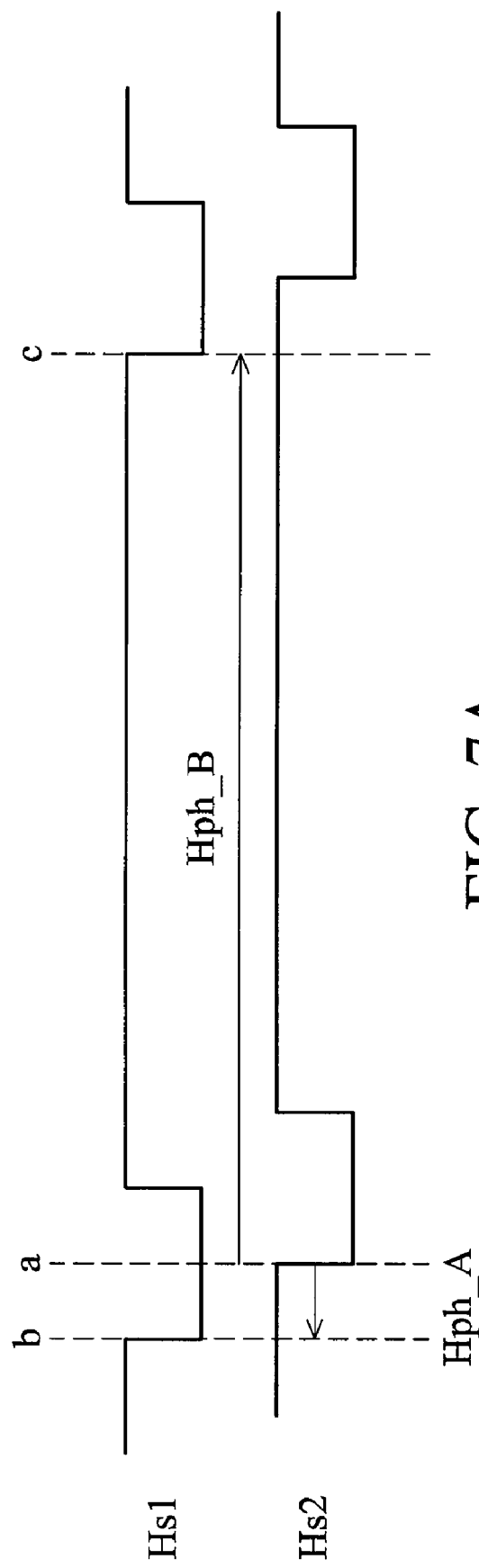

METHODS AND DEVICES FOR SIGNAL SYNCHRONIZATION

BACKGROUND OF THE INVENTION

1. Field of the Invention

The invention relates to a method and device for signal synchronization, and in particular, to a method of adjusting a dummy period to make a receiving device to receive data from an output device synchronously.

2. Description of the Related Art

Currently, phase locked loops (PLLs) remain a core of clock generators. A clock generator generates clocks of different frequencies by phase locked loops (PLLs), receiving the same base frequency provided by a crystal, associated with different frequency dividers such that multiple crystal oscillators in a conventional system are replaced.

A phase locked loop (PLL) has two input terminals respectively receiving a reference frequency Fref and a feedback frequency Fvco and an output terminal receiving an output frequency Fout. The relationship between the frequencies is expressed as Fout=(Fref×P)/(Q×N).

A phase locked loop (PLL), a negative feedback system, comprises a feedback signal in the loop utilized to lock frequency and phase of an output signal to the reference signal on the input terminal. A phase frequency detector (PFD) compares frequencies and phases of the reference frequency Fref and the feedback frequency Fvco and detects differences therebetween such that output frequency of a voltage controlled oscillator (VCO) is controlled thereby. When Fref/Q exceeds Fvco/P, a high voltage output UP increases the output frequency Fout. Conversely, when Fref/Q is lower than Fvco/P, a high voltage output DN reduces the output frequency Fout. As a result, a stable output state as shown by the formula is eventually achieved. Accordingly, P, Q, and R of the frequency dividers of the PLL are adjusted such that a required frequency is obtained.

Generally, clocks of devices in a system are generated by the aforementioned PLL. The clocks generated by the PLL, however, generate considerable noise. The devices in the system may receive the clock signal provided by the PLL. While ideally, the devices receive the same clock signal, there is a slight difference. As a result, a receiving device cannot receive data output from an output device during data transmission.

FIG. 1 is a block diagram of a conventional image system. In FIG. 1, the image system 100 comprises image decoder 101 and digital signal processor 103. Image decoder 101 and digital signal decoder 103 respectively receive clock signals Clock 1 and Clock 2. When data 105 is transmitted from image decoder 101 to digital signal processor 103, digital signal processor 103 may not be synchronized with the data 105 from the image decoder due to different clock signals Clock 1 and Clock 2.

The invention provides a method and a signal synchronization device wherein a receiving device can be synchronized with data from an output device even when clock signals thereof are skewed.

BRIEF SUMMARY OF THE INVENTION

The invention enables a receiving device to be synchronized with data from an output device even when clock signals thereof are skewed. The invention provides a signal synchronization method comprising determining whether a receiving device is synchronized with an output signal of an output device, and adjusting a dummy period such that the receiving device is synchronized with the output signal of the output device when the receiving device is not synchronized with the output signal of the output device.

In an embodiment of the invention, the output signal of the output device comprises a first synchronous signal and a data signal. The receiving device generates a second synchronous signal according to a second clock. The first and second synchronous signals are compared to determine whether the receiving device is synchronized with the output signal of the output device.

In another embodiment of the invention, the first synchronous signal further comprises a first horizontal synchronization (HSync) signal and a first vertical synchronization (VSync) signal. The second synchronous signal further comprises a second horizontal synchronization (HSync) signal and a second vertical synchronization (VSync) signal. The first and second vertical synchronous signals are compared to determine whether the receiving device is synchronized with the output signal of the output device. If the first and second vertical synchronous signals are not synchronized, an amount, duration, or both of the second horizontal synchronous signals in the second vertical synchronous signal are adjusted to refine duration of the second vertical synchronous signal.

In yet another embodiment, the first and second synchronous signals are compared to determine whether the receiving device is synchronized with the output signal of the output device. If not synchronized, data length of the output signal or, duration of the second horizontal synchronous signal, or both, are adjusted to achieve synchronization.

The invention provides a signal synchronization device which synchronizes a receiving device with synchronous signal and data signals from an output device. The signal synchronization device adjusts a second synchronous signal received by a receiving device according to a first synchronous signal and a first clock signal from the output device and a second clock signal from the receiving device.

In an embodiment, the signal synchronization device further comprises a detector and a signal generator. The detector detects the first and second clock signals from the output and receiving devices, and the first and second synchronous signals and generates a synchronous deviation signal. The signal generator generates a second synchronous signal according to the second clock signal and adjusts duration of the second synchronous signal according to the synchronous deviation signal.

In addition, the invention provides a signal synchronization method for a second terminal receiving an output signal from a first terminal. The signal synchronization method comprises determining whether the second terminal receives the output signal from the first terminal synchronously and adjusting data length of receiving signal of the second terminal to make the second terminal receive the output signal from the first terminal synchronously. The first terminal outputs a first signal using a first clock signal and determination of whether the second terminal receives the output signal from the first terminal synchronously further comprises generating a second signal for the second terminal according to the first clock signal, the first signal and a second clock signal used by the second terminal and comparing the first and second signals to determine whether the second terminal receives the first signal from the first terminal synchronously. Generation of a second signal according to the first clock signal, the first signal and the second clock signal further comprises simulating the second clock reading the first signal correctly to generate the second signal. The signal synchronization method further comprises determining whether the second terminal can receive the first signal synchronously according to variations in phase difference of the first signal and the second signal. In addition, the signal synchronization method further comprises comparing start/end signals of heads of the first signal and second signal and deciding a receiving speed of the second terminal exceeding an output speed of the first terminal when start/end signals of heads of the second signal move faster than start/end signals of heads of the first signal and vice versa.

In an embodiment of the invention, a signal transmitted between the first terminal and the second terminal is a bit stream signal or packet signal. If the signal is a packet signal and the second terminal cannot receive the output signal from the first terminal synchronously, the signal synchronization method further comprises adjusting length of heads of the packet signal, adjusting length of data of the packet signal, or dividing or integrating the packet signal. Adjustment of length of heads of the packet signal further comprises increasing length of heads of the packet signal when the receiving speed of the second terminal exceeds the output speed of the first terminal and decreasing length of heads of the packet signal when the receiving speed of the second terminal is lower than the output speed of the first terminal. Adjustment of length of data of the packet signal further comprises increasing length of data of the packet signal when the receiving speed of the second terminal exceeds the output speed of the first terminal and decreasing length of data of the packet signal when the receiving speed of the second terminal is lower than the output speed of the first terminal. The dividing or integrating the packet signal further comprises dividing the packet signal into two parts when the receiving speed of the second terminal exceeds the output speed of the first terminal and integrating the packet signal when the receiving speed of the second terminal exceeds the output speed of the first terminal. In addition, division or integration of the packet signal further comprises determining length of data of the packet signal by inserting dummy data into the packet signal when the data is too short after dividing and deleting dummy data of the packet signal when the data is too long after integrating.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 7A and 7B are respectively a schematic diagram of phase difference between the horizontal synchronous signals Hs1 and Hs2 and a flowchart of a method of adjusting the horizontal synchronous signal Hs2;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
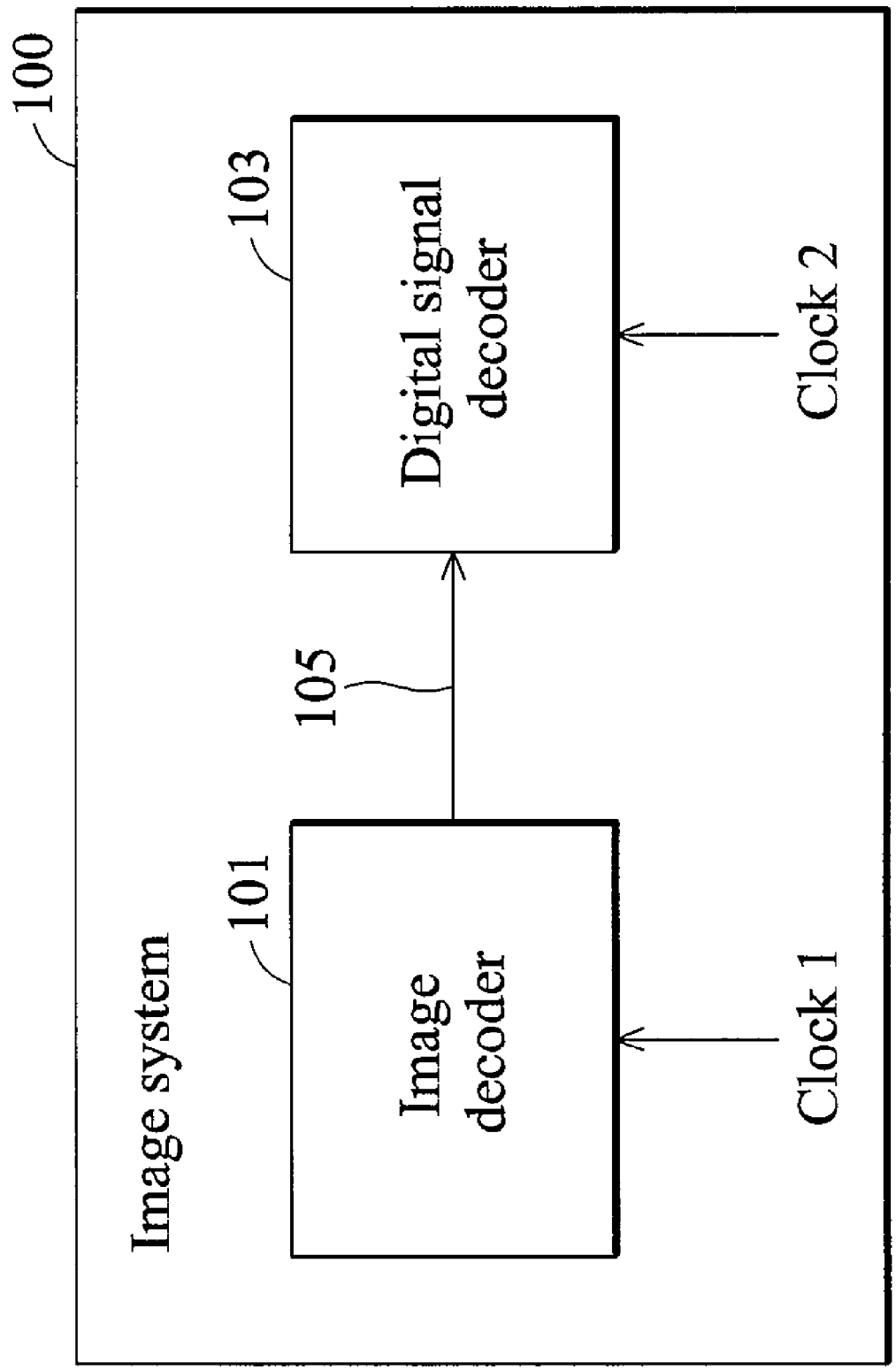
FIG. 1 is a block diagram of a conventional image system.
Figure 2A:
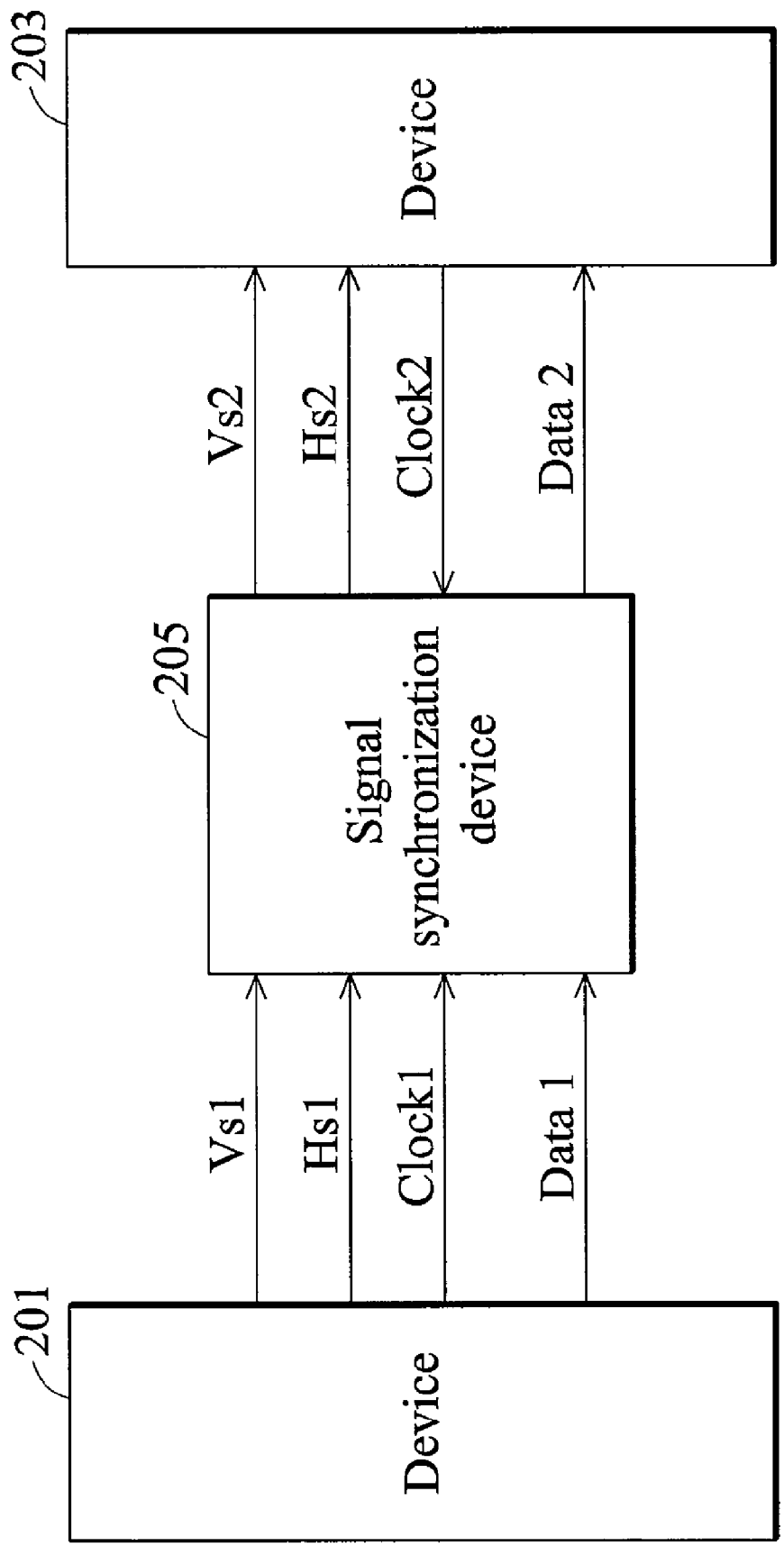
FIGS. 2A and 2B are block diagrams of signal synchronization devices in an image system according to an embodiment of the invention.
Figure 2B:
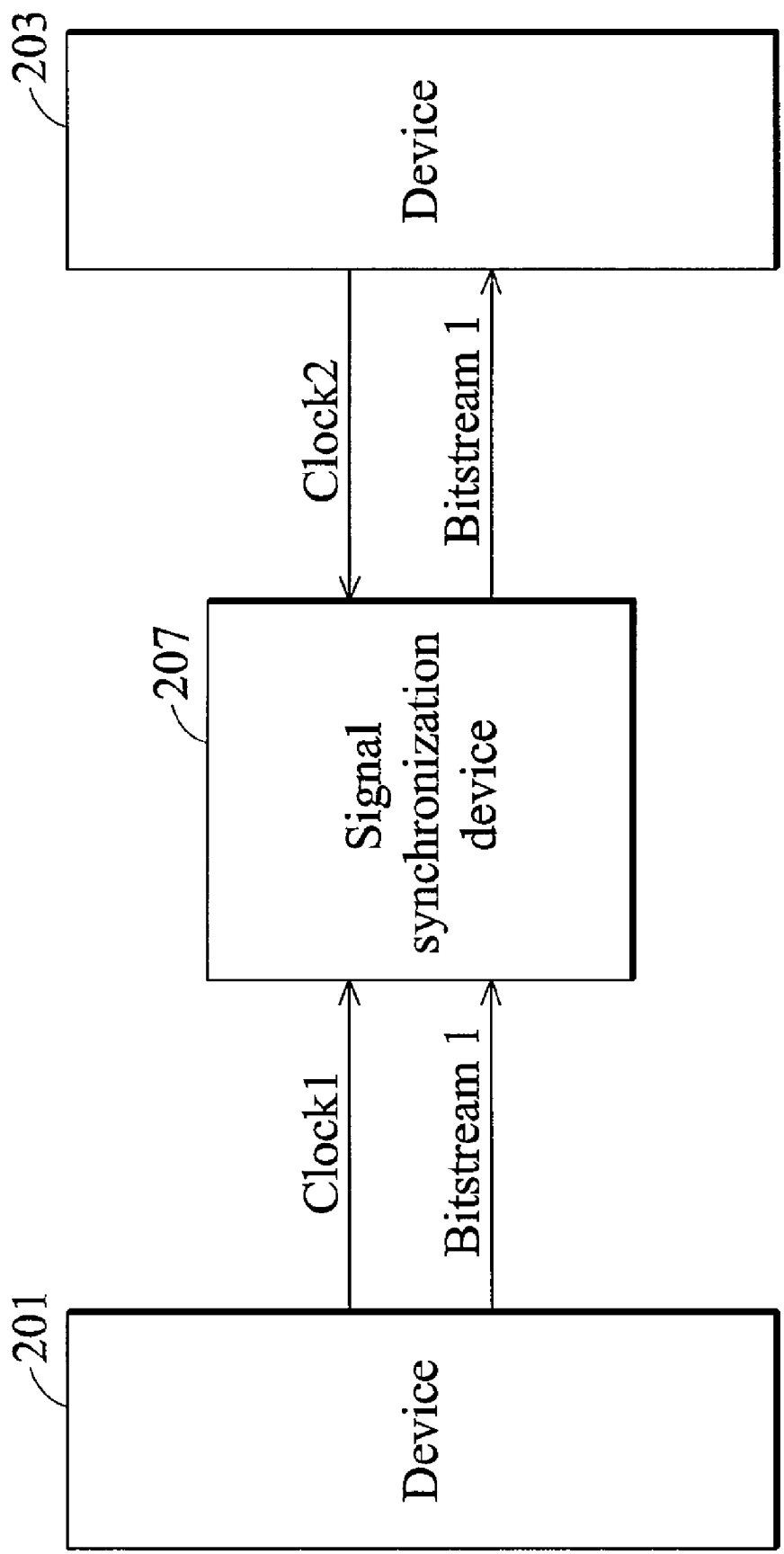

FIGS. 2A and 2B are block diagrams of a signal synchronization device in an image system according to an embodiment of the invention. In FIG. 2A, device 201 provides horizontal synchronous signal Hs1, vertical synchronous signal Vs1 and data Data1 to device 203. The signal synchronization device 205 adjusts horizontal synchronous signal Hs1, vertical synchronous signal Vs1 and data Data1 according to clock signals Clock1 and Clock2 from devices 201 and 203 such that device 203 receives the adjusted signals, horizontal synchronous signal Hs2, vertical synchronous signal Vs2 and data Data2. Device 203 is synchronized with data Data1 via the adjustment. It is noted that horizontal synchronous signal Hs2 and vertical synchronous signal Vs2 are generated according to clock signal Clock2. Accordingly, signal synchronization is accomplished according to clock signals Clock1 and Clock2 from the devices 201 and 203.

Similarly, in FIG. 2B, bit stream signal Bitstream1 comprising synchronous signals and following data is transmitted by device 201. Signal synchronization device 207 decodes the synchronous signals from bit stream signal Bitstream1 and adjusts bit stream signal Bitstream1 according to clock signals Clock1 and Clock 2 from devices 201 and 203. After adjustment, bit stream signal Bitstream1 becomes bit stream signal Bitstream2. Accordingly, device 203 is synchronized with bit stream signal Bitstream1 from the device 201.

Figure 3A:
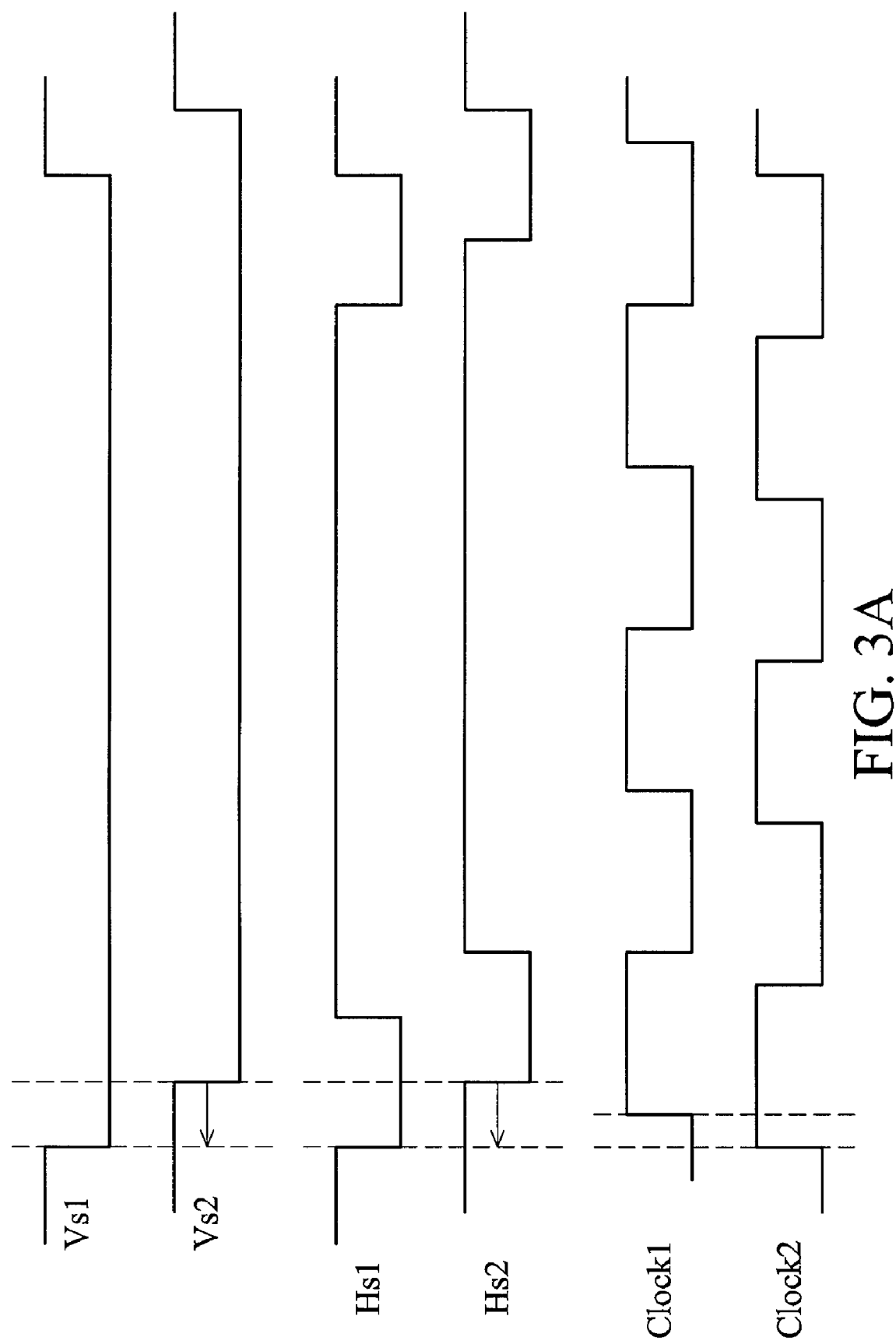
FIGS. 3A and 3B are timing diagrams of signals associated with the signal synchronization device in FIG. 2A.
Figure 3B:
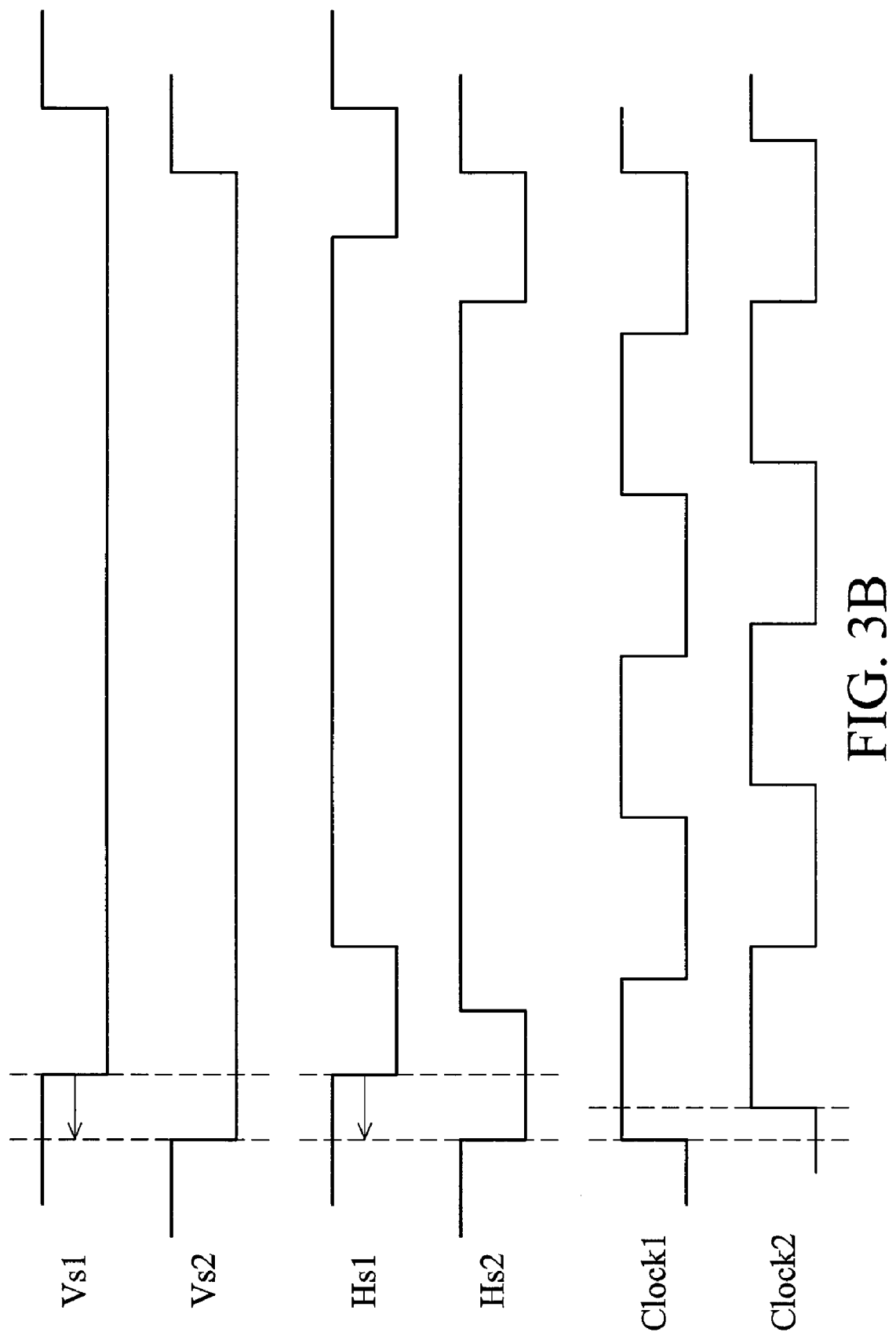

FIGS. 3A and 3B are timing diagrams of signals associated with the signal synchronization devices in FIG. 2A. In FIG. 3A, frequency of clock signal Clock1 is lower than clock signal Clock2. In this case, frequency of vertical synchronous signal Vs1 is also lower than vertical synchronous signal Vs2, and horizontal synchronous signal Hs1 lower than horizontal synchronous signal Hs2. In other words, vertical synchronous signal Vs2 gradually keeps up with vertical synchronous signal Vs1, and horizontal synchronous signal Hs2 keeps up with horizontal synchronous signal Hs1.

Signal synchronization device 205 in FIG. 2A adjusts duration of vertical synchronous signal Vs2 according to phase differences between edges (rising edges or falling edges) of vertical synchronous signals Vs1 and Vs2 or duration of horizontal synchronous signal Hs2 according to phase differences between edges (rising edges or falling edges) of horizontal synchronous signals Hs1 and Hs2. Thus, device 203 is synchronized with data Data1 from the device 201.

Figure 4A:
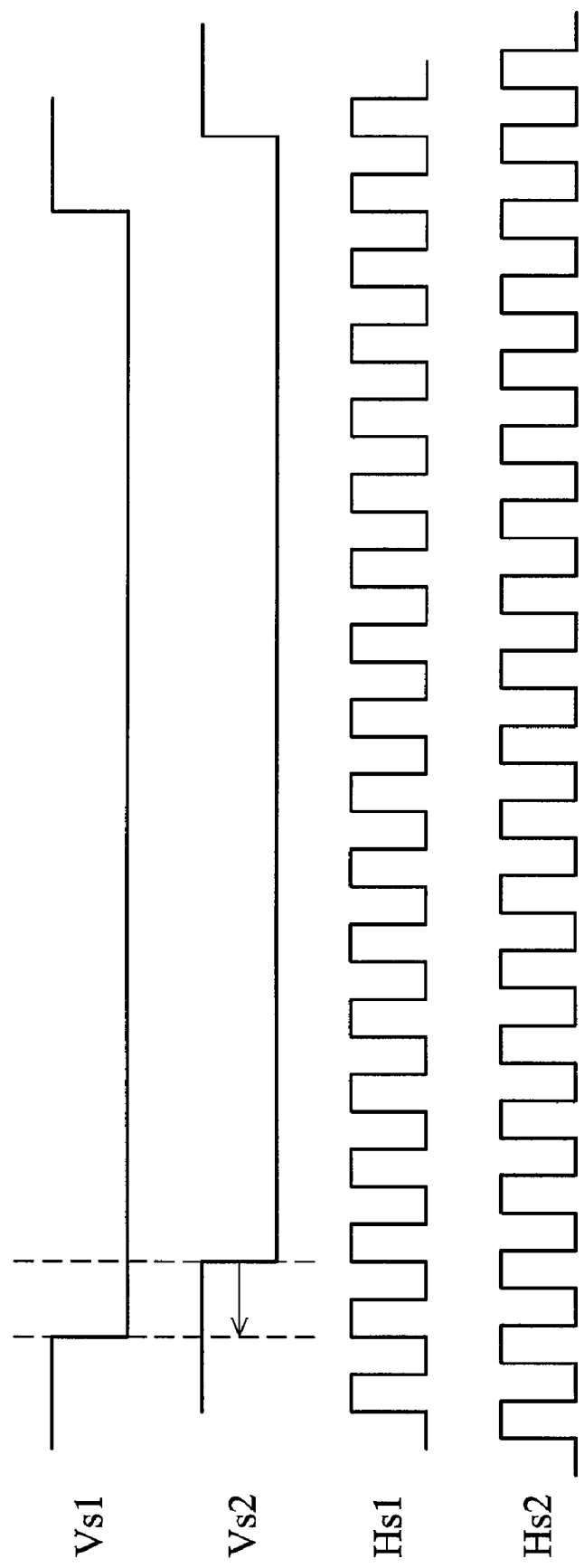
FIGS. 4A, 4B, 5A, and 5B are schematic diagrams of adjustments of the vertical synchronous signal Vs2 and the horizontal synchronous signal Hs2.

FIGS. 4A, 4B, 5A, and 5B are schematic diagrams of adjustments of vertical synchronous signal Vs2 and horizontal synchronous signal Hs2. In FIG. 4A, vertical synchronous signal Vs2 gradually keeps up with vertical synchronous signal Vs1. Thus, amounts of horizontal synchronous signal Hs2 in a duration of vertical synchronous signal Vs2 or duration of horizontal synchronous signal Hs2 can be increased such that vertical synchronous signal Vs2 is synchronized with vertical synchronous signal Vs1. Thus, device 203 is synchronized with data Data1 via synchronization of vertical synchronous signals Vs1 and Vs2.

Figure 4B:
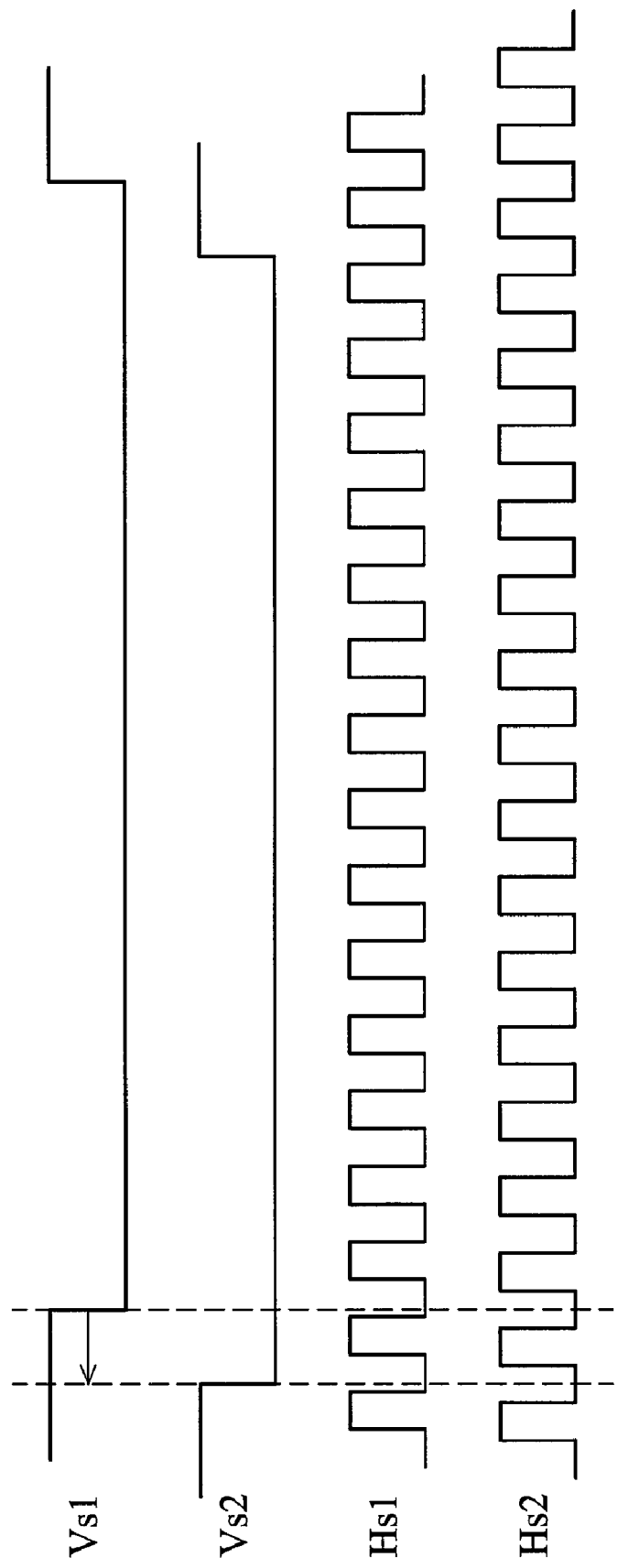

Conversely, in FIG. 4B, vertical synchronous signal Vs1 gradually keeps up with vertical synchronous signal Vs2. Thus, amounts of horizontal synchronous signal Hs2 in a duration of vertical synchronous signal Vs2 or duration of horizontal synchronous signal Hs2 can be decreased such that vertical synchronous signal Vs2 is synchronized with vertical synchronous signal Vs1.

Figure 5A:
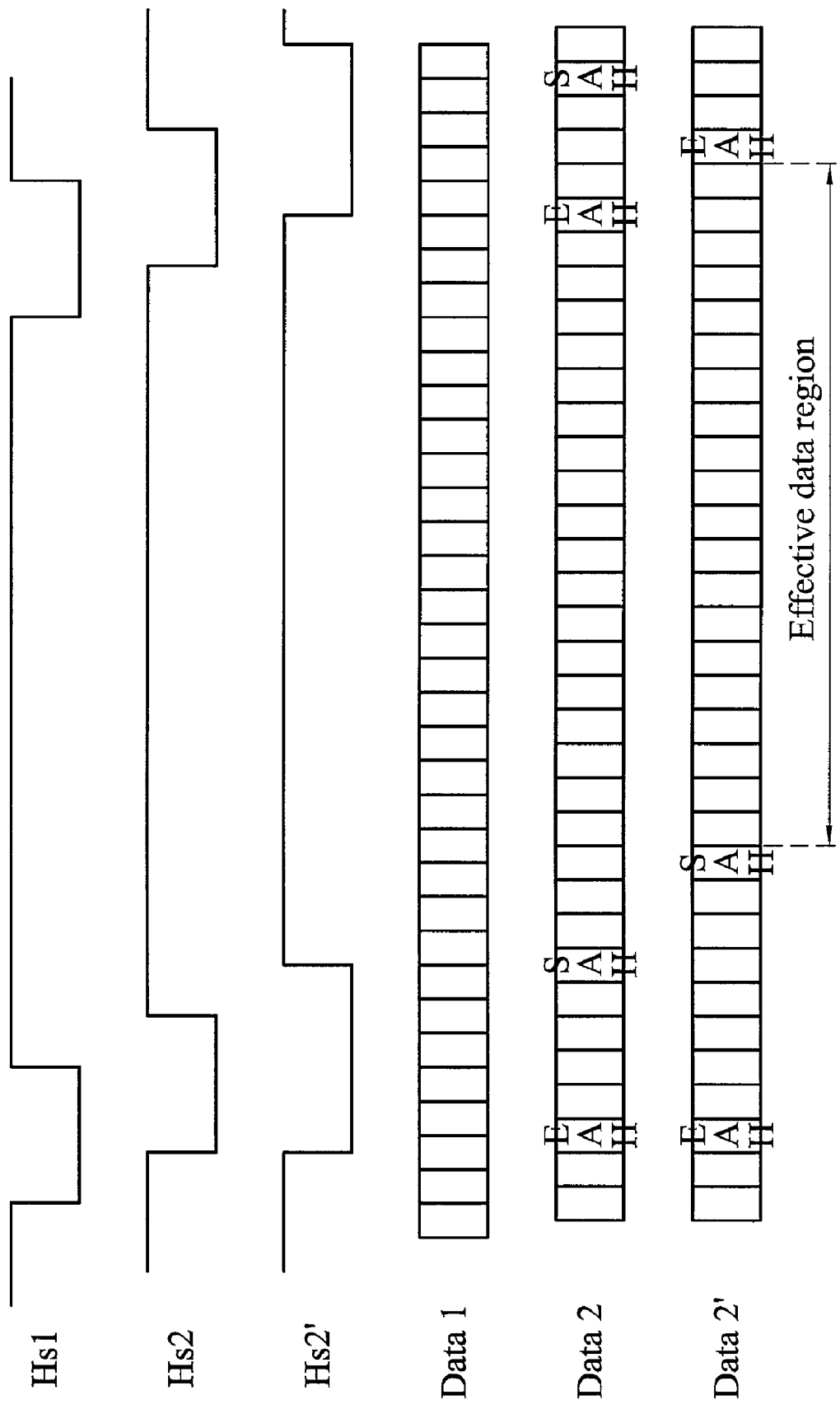
Figure 5B:
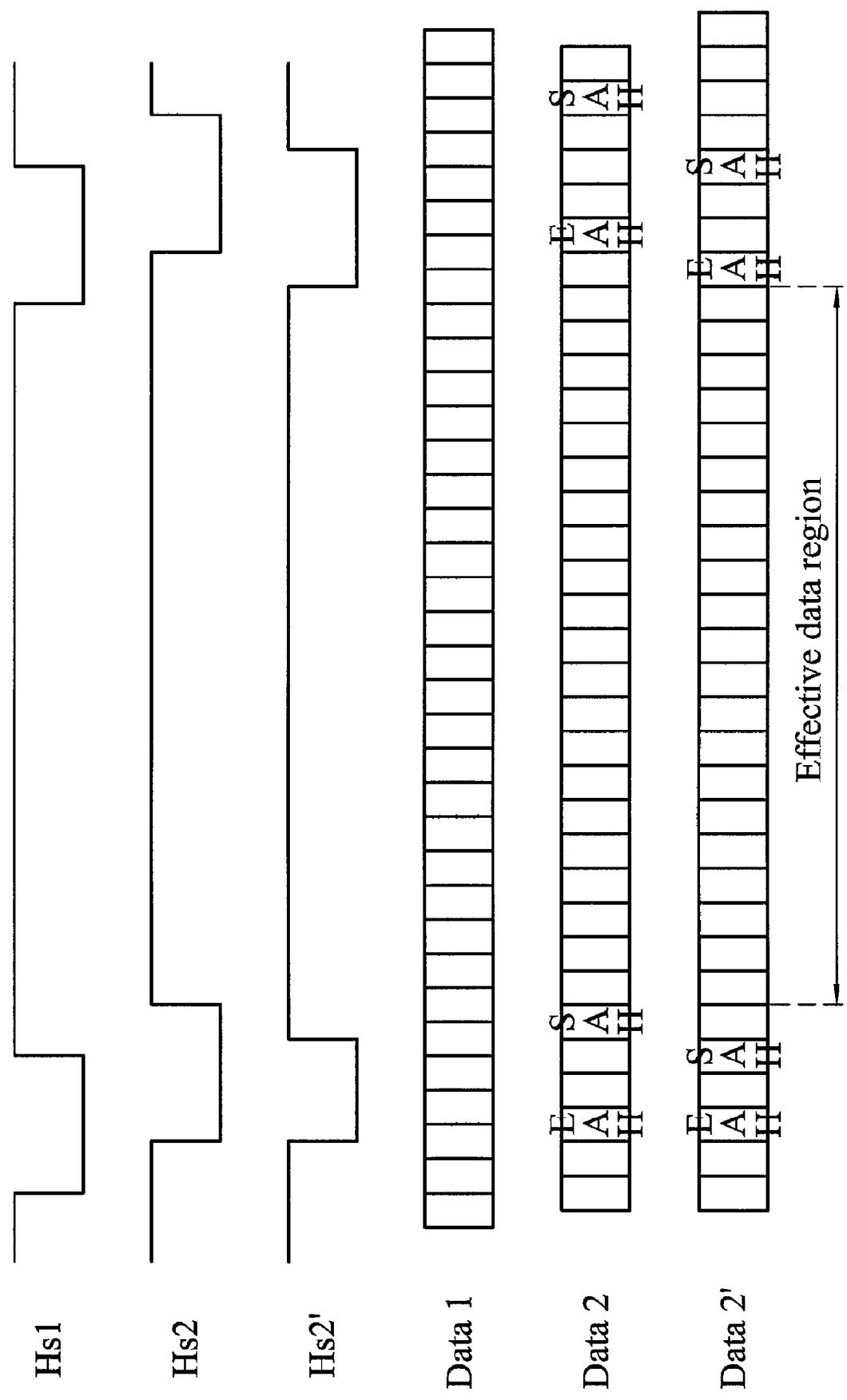

In FIG. 5A, horizontal synchronous signal Hs2 gradually keeps up with horizontal synchronous signal Hs1. Receiving device 203 is supposed to receive data Data1 from device 201 but actually receives data Data2 due to asynchronicity. Device 203 can be synchronized with data Data1 and receives data Data2 by directly increasing duration of horizontal synchronous signal Hs2. In addition, dummy data can be inserted in data Data2 (changing amount of out signal Data2) such that data Data1 and Data2' are synchronized. In FIG. 5B, EAH (End of Active data of a H line) is an end of active data of a horizontal scan line and SAH (Start of Active data of a H line) is a start of active data of a horizontal scan line. Dummy data is inserted into a header region (from EAH to SAH) of data Data2 such that duration of the header region is increased and duration of effective data region (from SAH to EAH) is decreased correspondingly. As a result, transmission of the effective data region is delayed and device 203 is synchronized with data Data1.

Both methods of increasing duration of horizontal synchronous signal and inserting dummy data can be implemented such that device 203 can receive data Data1 from device 201 synchronously.

Conversely, as shown in FIG. 5B, horizontal synchronous signal Hs1 gradually keeps up with horizontal synchronous signal Hs2. Device 203 can be synchronized with data Data1 by decreasing duration of horizontal synchronous signal Hs2 or decreasing amount of data Data2 (as shown by Data2').

Figure 6A:
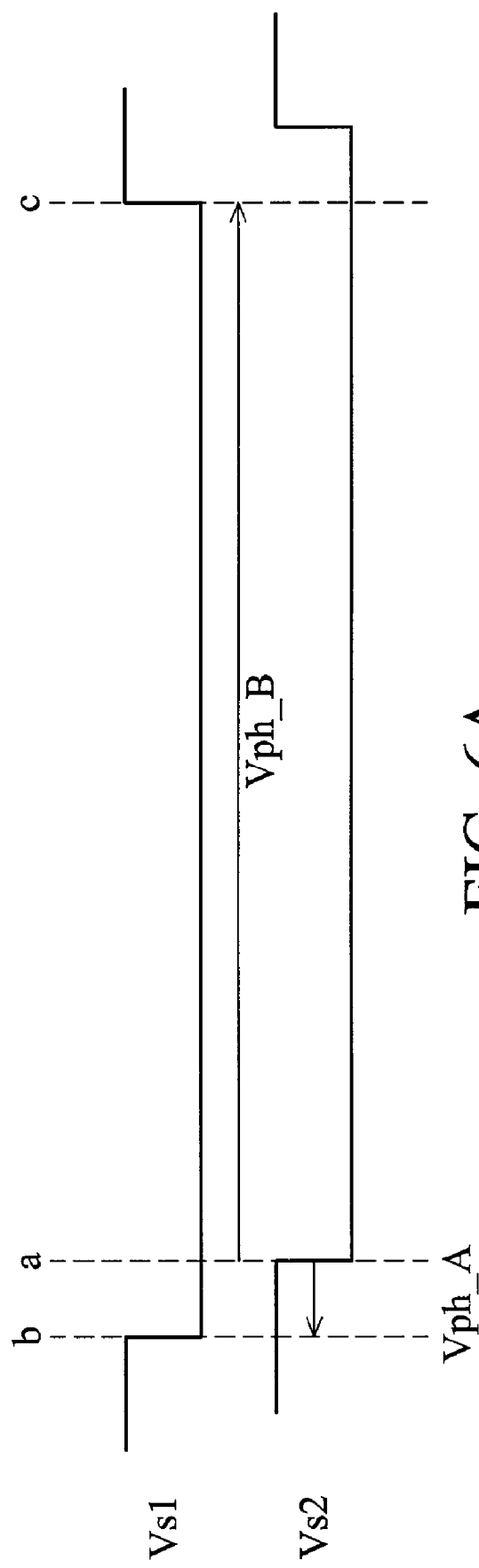
FIGS. 6A and 6B are respectively a schematic diagram of phase difference between the vertical synchronous signals Vs1 and Vs2 and a flowchart of a method of adjusting the vertical synchronous signal Vs2.
Figure 6B:
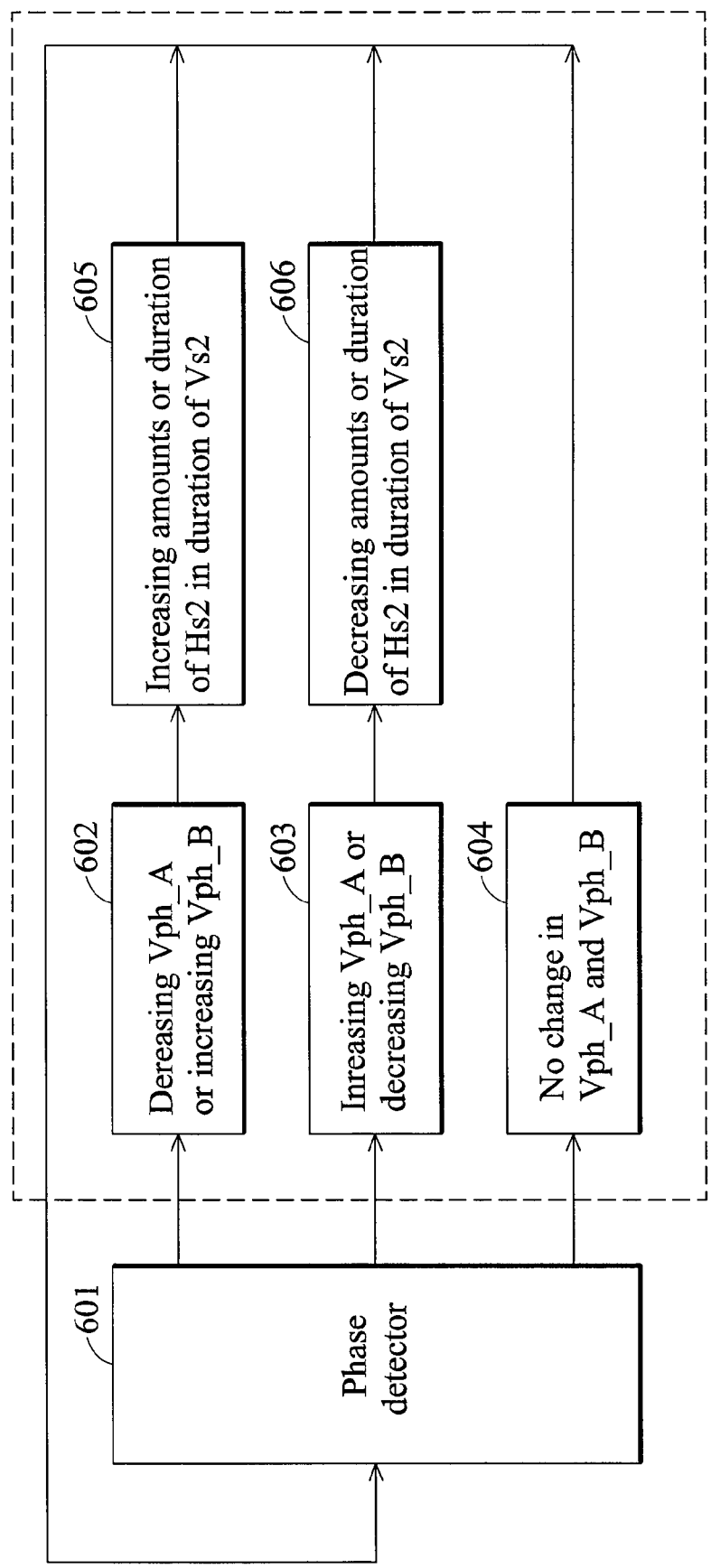
Figure 7B:
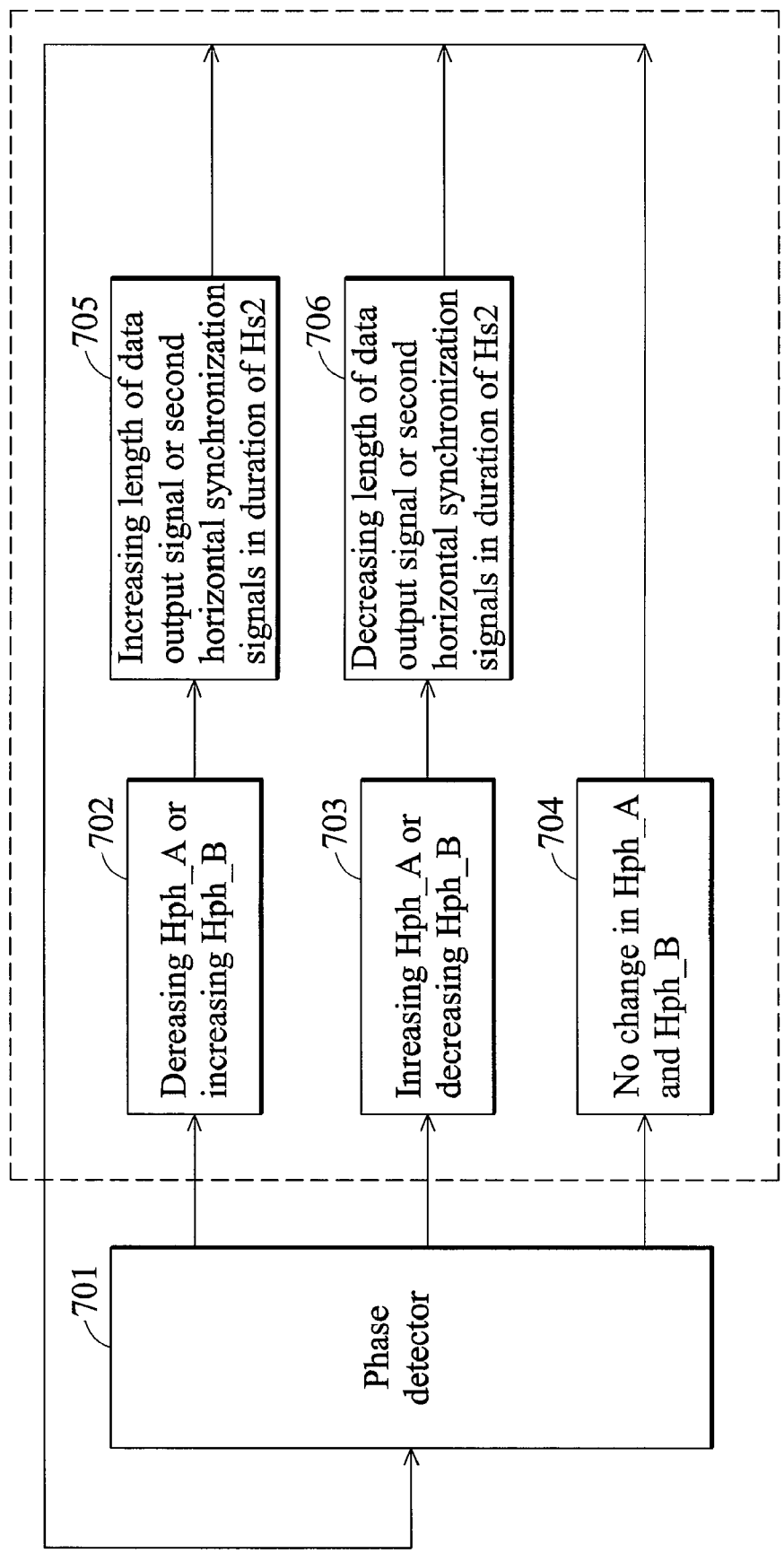

FIGS. 6A and 6B are respectively a schematic diagram of phase difference between vertical synchronous signals Vs1 and Vs2 and a flowchart of a method of adjusting vertical synchronous signal Vs2. FIGS. 7A and 7B are respectively a schematic diagram of phase difference between horizontal synchronous signals Hs1 and Hs2 and a flow chart of a method of adjusting horizontal synchronous signal Hs2.

Referring to FIG. 6A, an edge a (rising edge or falling edge) of vertical synchronous signal Vs2 is compared with edges b and c, respectively a rising edge and a falling edge, of vertical synchronous signal Vs1. Vph_A is a phase difference between edges a and b and Vph_B is a phase difference between edges a and c.

Referring to FIG. 6B, the method of adjusting vertical synchronous signal Vs2 starts with measuring phase differences between the edges of vertical synchronous signals Vs2 and Vs1 and determining whether frequency of vertical synchronous signal Vs2 is higher than Vs1 (step 601). Decreasing phase difference Vph_A or increasing phase difference Vph_B leads to conclusion 602 that the frequency of vertical synchronous signal Vs2 is higher than the frequency of vertical synchronous signal Vs1. Increasing phase difference Vph_A or decreasing phase difference Vph_B leads to conclusion 603 that the frequency of vertical synchronous signal Vs2 is lower than the frequency of vertical synchronous signal Vs1. If the phase differences Vph_A and Vph_B do not change, it is concluded that the frequencies of vertical synchronous signals Vs1 and Vs2 are the same. This conclusion 604 means that vertical synchronization Vs2 requires no adjustment and is ready for receiving device 203.

According to conclusion 602, amounts of horizontal synchronous signal Hs2 in duration of vertical synchronous signal Vs2 or duration of horizontal synchronous signal Hs2 in duration of vertical synchronous signal Vs2 can be increased such that duration of vertical synchronous signal Vs2 is increased (step 605). Thus, vertical synchronous signal Vs2 is ready for receiving device 203 after adjustment. According to conclusion 603, amounts of horizontal synchronous signal Hs2 in duration of vertical synchronous signal Vs2 are decreased or duration of the horizontal synchronous signal Hs2 in duration of the vertical synchronous signal Vs2 can be decreased such that duration of vertical synchronous signal Vs2 is decreased (step 606). Thus, vertical synchronous signal Vs2 is ready for receiving device 203 after adjustment.

Referring to FIG. 7A, edge a (rising edge or falling edge) of horizontal synchronous signal Hs2 is compared with edges b and c, respectively a rising edge and a falling edge, of horizontal synchronous signal Hs1. Hph_A is a phase difference between edges a and b and Hph_B is a phase difference between edges a and c.

Referring to FIG. 7B, the method of adjusting horizontal synchronous signal Hs2 starts with measuring phase differences between the edges of horizontal synchronous signals Hs2 and Hs1 and determining whether the frequency of horizontal synchronous signal Hs2 is higher than the frequency of horizontal synchronous signal Hs1 (step 701). Decreasing phase difference Hph_A or increasing phase difference Hph_B leads to conclusion 702 that the frequency of horizontal synchronous signal Hs2 is higher than the frequency of Hs1. Increasing phase difference Hph_A or decreasing phase difference Hph_B leads to conclusion 703 that the frequency of horizontal synchronous signal Hs2 is lower than the frequency of horizontal synchronous signal Hs1. If phase differences Vph_A and Vph_B do not change, it is concluded that the frequencies of horizontal synchronous signals Hs1 and Hs2 are the same. This conclusion 704 means that horizontal synchronization Hs2 requires no adjustment and is ready for receiving device 203.

According to the conclusion 702, duration of horizontal synchronous signal Hs2 in duration of horizontal synchronous signal Hs2 or length of Data1 (shown in FIG. 2) in duration of horizontal synchronous signal Hs2 can be increased such that duration of horizontal synchronous signal Hs2 is increased (step 705). Thus, horizontal synchronous signal Hs2 is ready for receiving device 203 after adjustment. According to conclusion 703, duration of horizontal synchronous signal Hs2 in duration of horizontal synchronous signal Hs2 or length of Data1 (shown in FIG. 2) in duration of horizontal synchronous signal Hs2 can be decreased such that duration of horizontal synchronous signal Hs2 is decreased (step 706). Thus, horizontal synchronous signal Hs2 is ready for the receiving device 203 after adjustment.

Figure 8:
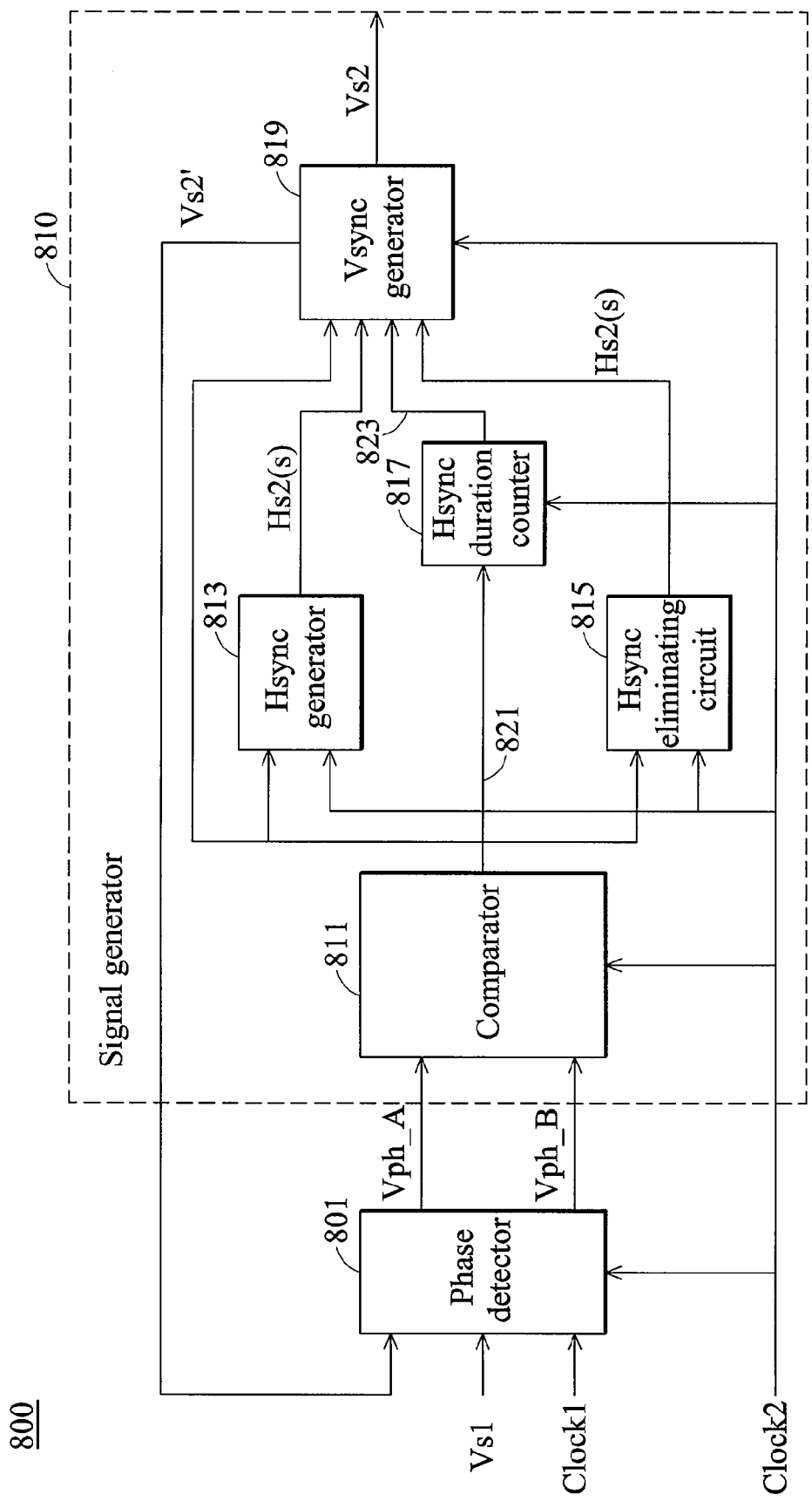
FIG. 8 is a block diagram of a signal synchronization device according to an embodiment of the invention.

FIG. 8 is a block diagram of a signal synchronization device according to an embodiment of the invention. Signal synchronization device 800 comprises phase detector 801 and signal generator 810. Signal generator 810 further comprises comparator 811, Hsync generator 813, Hsync eliminating circuit 815, Hsync duration counter 817, and Vsync generator 819.

As shown in FIGS. 2A and 8, Vsync generator 819 generates vertical synchronous signal Vs2' according to clock signal Clock2 from device 203. Phase detector 801 detects and measures phase differences between vertical synchronous signals Vs1 and Vs2' and generates phase difference signal Vph_A, phase difference Vph_B, or both.

Comparator 811 receives phase difference Vph_A and generates parameter signal 821. Parameter signal 821 includes information about whether vertical synchronous signals Vs1 and Vs2' are synchronized and whether to increase or decrease amounts or duration of horizontal synchronous signal Hs2.

For example, a phase difference between vertical synchronous signals Vs1 and Vs2' equals 15.5 lines of horizontal synchronous signal Hs2 and phase difference Hph_A is decreasing. Thus, Hsync generator 813 generates 15 lines of the horizontal synchronous signal Hs2 in duration of vertical synchronous signal Vs2 according to parameter signal 821. Hsync duration counter 817 counts half line of horizontal synchronous signal Hs2 and generates count result 823. Vsync generator 819 adjusts duration of vertical synchronous signal Vs2' according to the 15 lines of horizontal synchronous signal Hs2 generated by Hsync generator 813 and count result 823. As a result, vertical synchronous signal Vs2 is synchronized with vertical synchronous signal Vs1.

To the contrary, Hsync eliminating circuit 815 and Hsync duration counter 817 are controlled by parameter signal 821 and generate signals. As a result, Vsync generator 819 generates vertical synchronous signal Vs2 synchronized with vertical synchronous signal Vs1.

Figure 9:
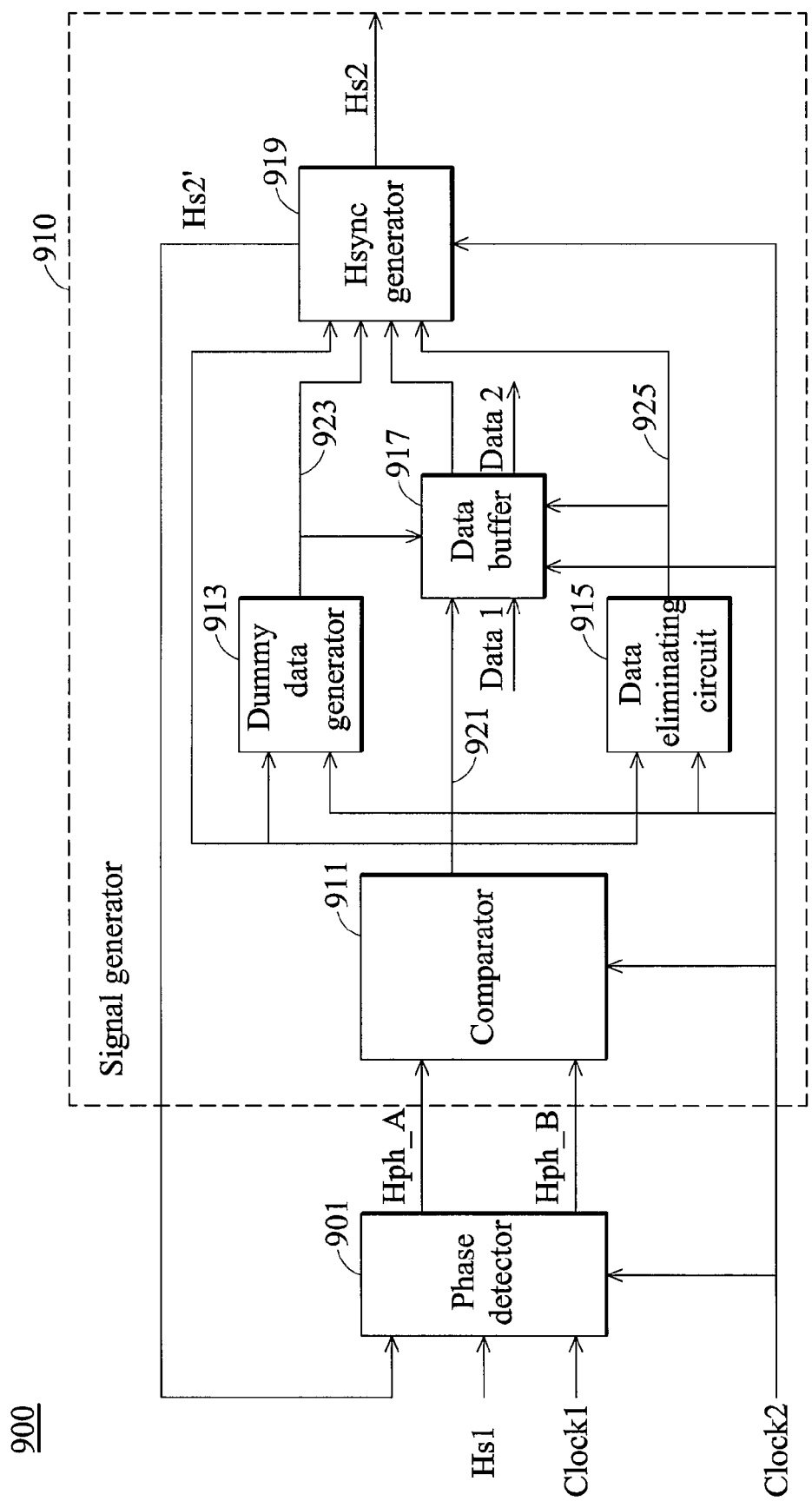
FIG. 9 is a block diagram of a signal synchronization device according to another embodiment of the invention.

FIG. 9 is a block diagram of a signal synchronization device according to another embodiment of the invention, in which signal synchronization device 900 comprises phase detector 901 and signal generator 910. Signal generator 910 further comprises comparator 911, dummy data generator 913, data eliminating circuit 915, data buffer 917, and Hsync generator 919.

As shown in FIGS. 2A and 9, Hsync generator 919 generates horizontal synchronous signal Hs2' according to clock signal Clock2 from device 203. Phase detector 901 detects and measures phase differences between horizontal synchronous signals Hs1 and Hs2' by using clock signals Clock1 and Clock2 and generates phase difference signal Hph_A, phase difference Hph_B, or both.

Comparator 911 receives phase difference Hph_A and generates parameter signal 921. Parameter signal 921 includes information about whether horizontal synchronous signals Hs1 and Hs2' are synchronized and whether to increase or decrease length of data and duration of horizontal synchronous signal Hs2.

For example, if a phase difference between horizontal synchronous signals Hs1 and Hs2' equals half line of horizontal synchronous signal Hs2 and phase difference Hph_A is decreasing, dummy data generator 913 generates positive signal 923 equaling a half line of horizontal synchronous signal Hs2 according to parameter signal 921. The Hsync generator 919 adjusts duration of horizontal synchronous signal Hs2' according to positive signal 923 such that horizontal synchronous signal Hs2 is synchronized with horizontal synchronous signal Hs1. Alternatively, data buffer 917 increases length of data Data1 according to positive signal 923. As a result, duration of horizontal synchronous signal Hs2 is substantially increased and horizontal synchronous signal Hs2 is thus synchronized with horizontal synchronous signal Hs1.

Conversely, data eliminating circuit 915 is controlled by parameter signal 921 and generates negative data signal 925. As a result, Hsync generator 919 generates horizontal synchronous signal Hs2 synchronized with horizontal synchronous signal Hs1.

Additionally, the signal synchronization devices shown in FIGS. 8 and 9 not only operate independently but also cooperate to accomplish signal synchronization of devices in the same system.

The invention provides a method and a signal synchronization device which enables a receiving device synchronized with data from an output device even when clock signals thereof are skewed.

Figure 10:
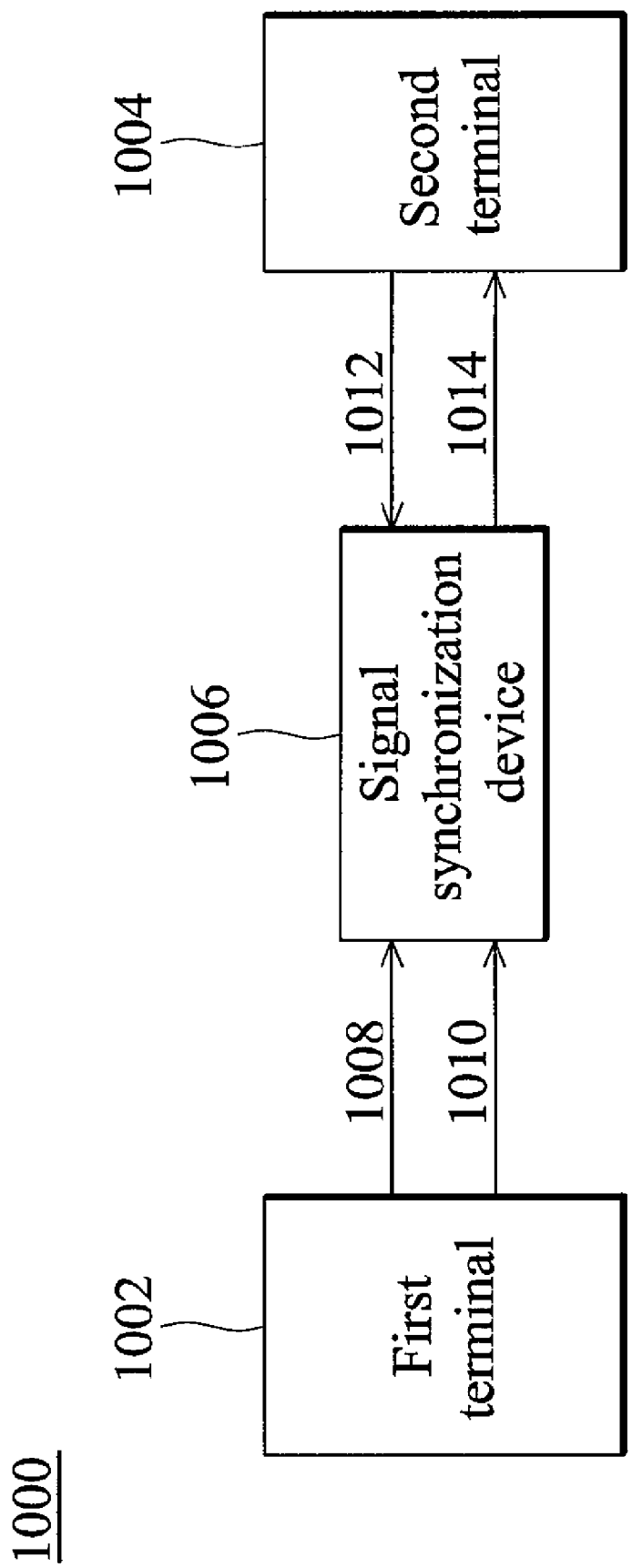
FIG. 10 shows a signal synchronization system according to an embodiment of the invention.

FIG. 10 shows signal synchronization system 1000 according to an embodiment of the invention. First terminal 1002 generates first signal 1010 according to first clock signal 1008. Second clock signal 1012 is output from second terminal 1004. Signal synchronization device 1006 uses first clock signal 1008, first signal 1010 and second clock 1012 to generate second signal 1014 received by second terminal 1004 according to a signal synchronization method of the invention.

Figure 11:
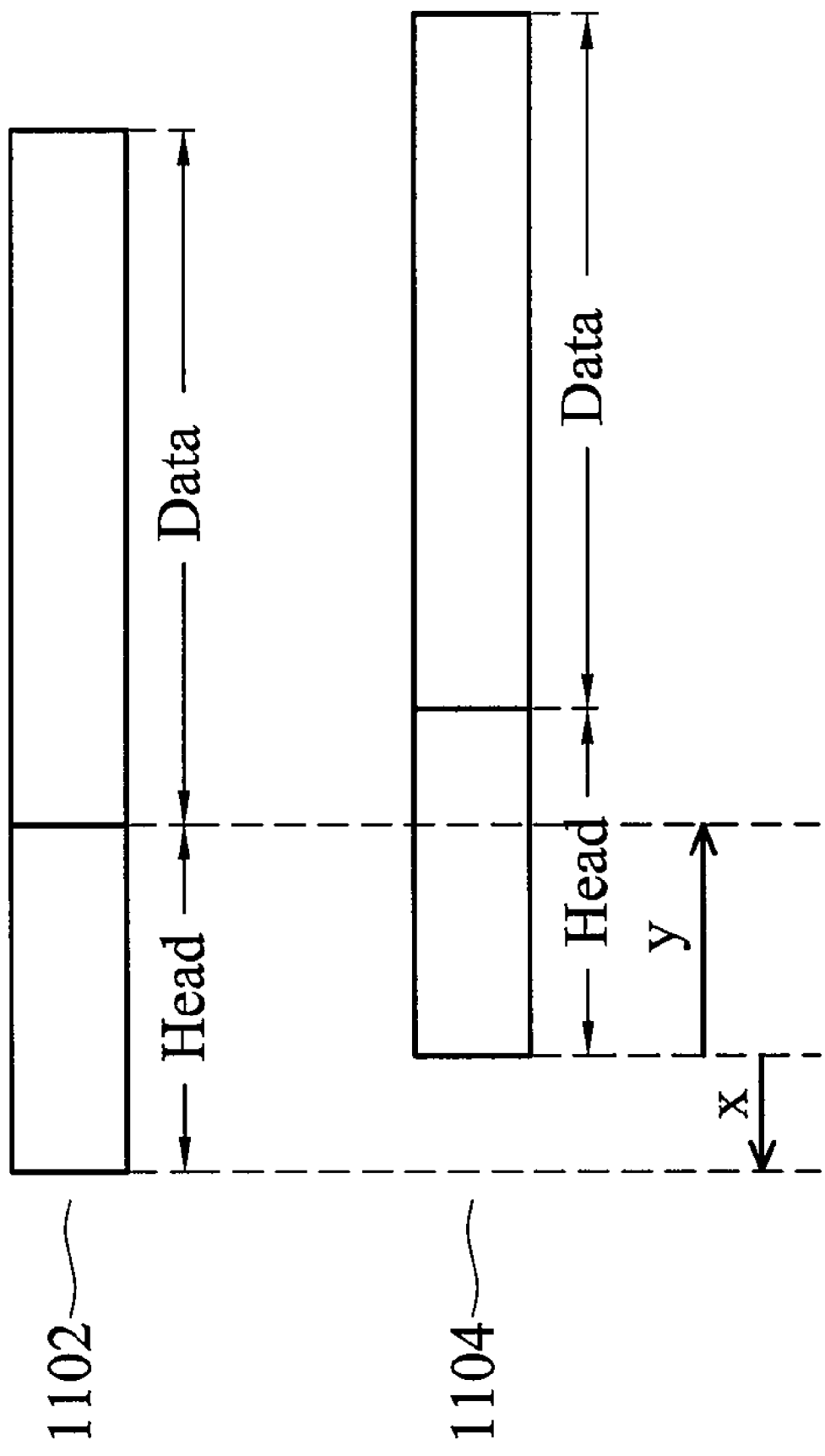
FIG. 11 illustrates detection of phase difference between signals 1102 and 1104.
Figure 12:
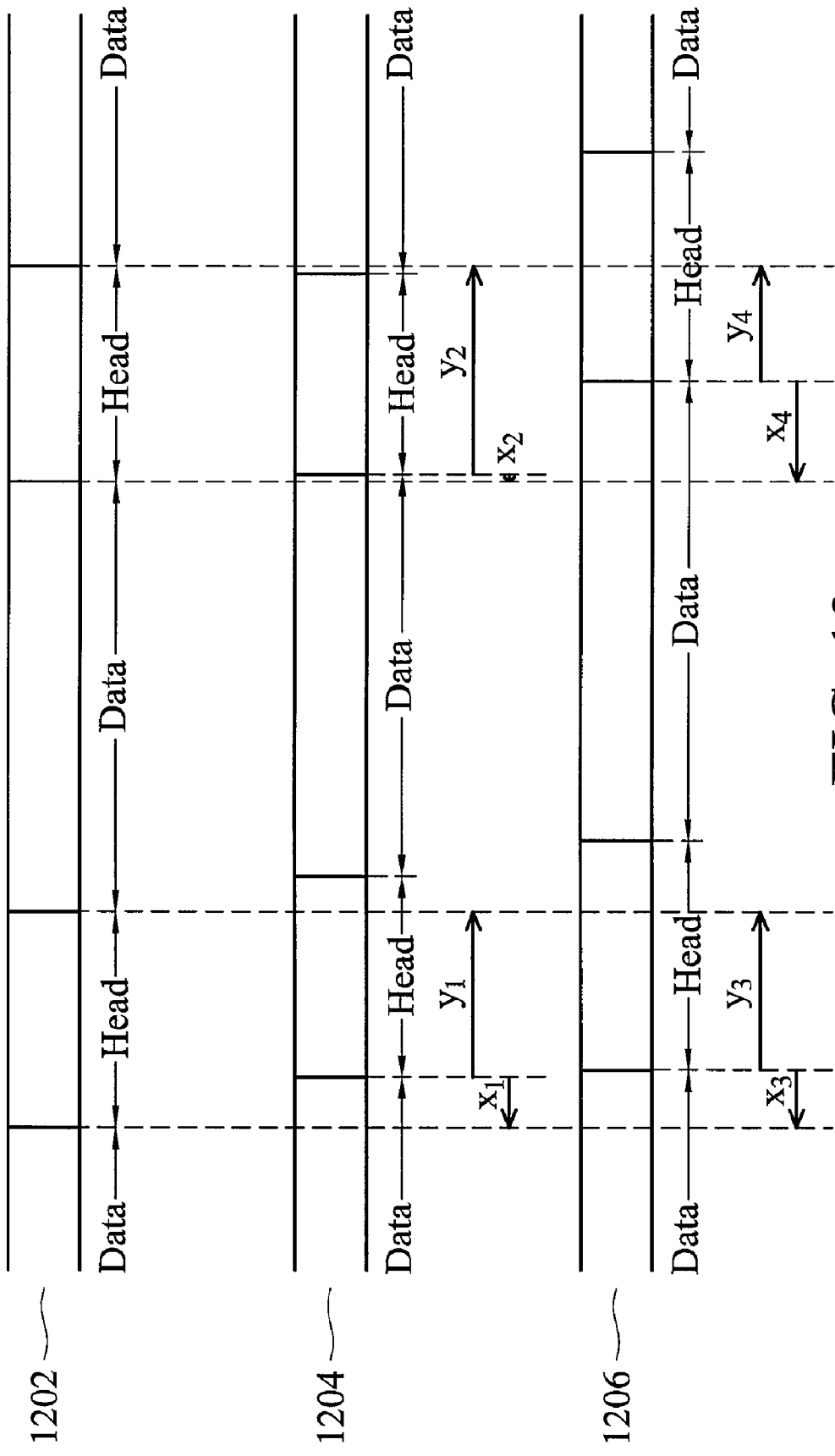
FIG. 12 illustrates how using the second clock signal to read the first signal for generating the second signal.

FIG. 11 illustrates detection of phase difference between signals 1102 and 1104. Phase difference x is a difference between a starting signal of head of signal 1104 and a starting signal of a head of signal 1102. Phase difference y is a difference between a starting signal of a head of signal 1104 and an ending signal of a head of signal 1102. Synchronicity of signals 1102 and 1104 is determined by observing phase difference x or y. Using FIG. 12 as an example, signal 1202 is output from the first terminal and signals 1204 and 1206 are presented by using the clock signal of the second terminal. Signal 1204 illustrates that if the frequency of the clock signal of the second terminal is higher, phase difference x1 decreases to phase difference X2 and phase difference y1 increases to phase difference y2. Signal 1206 illustrates that if the frequency of the clock signal of the second terminal is lower, phase difference x3 increases to phase difference X4 and phase difference y3 decreases to phase difference y4.

In the signal synchronization method of the invention, transmission between the first terminal and the second terminal can comprise a bit stream signal or packet signal.

Figure 13:
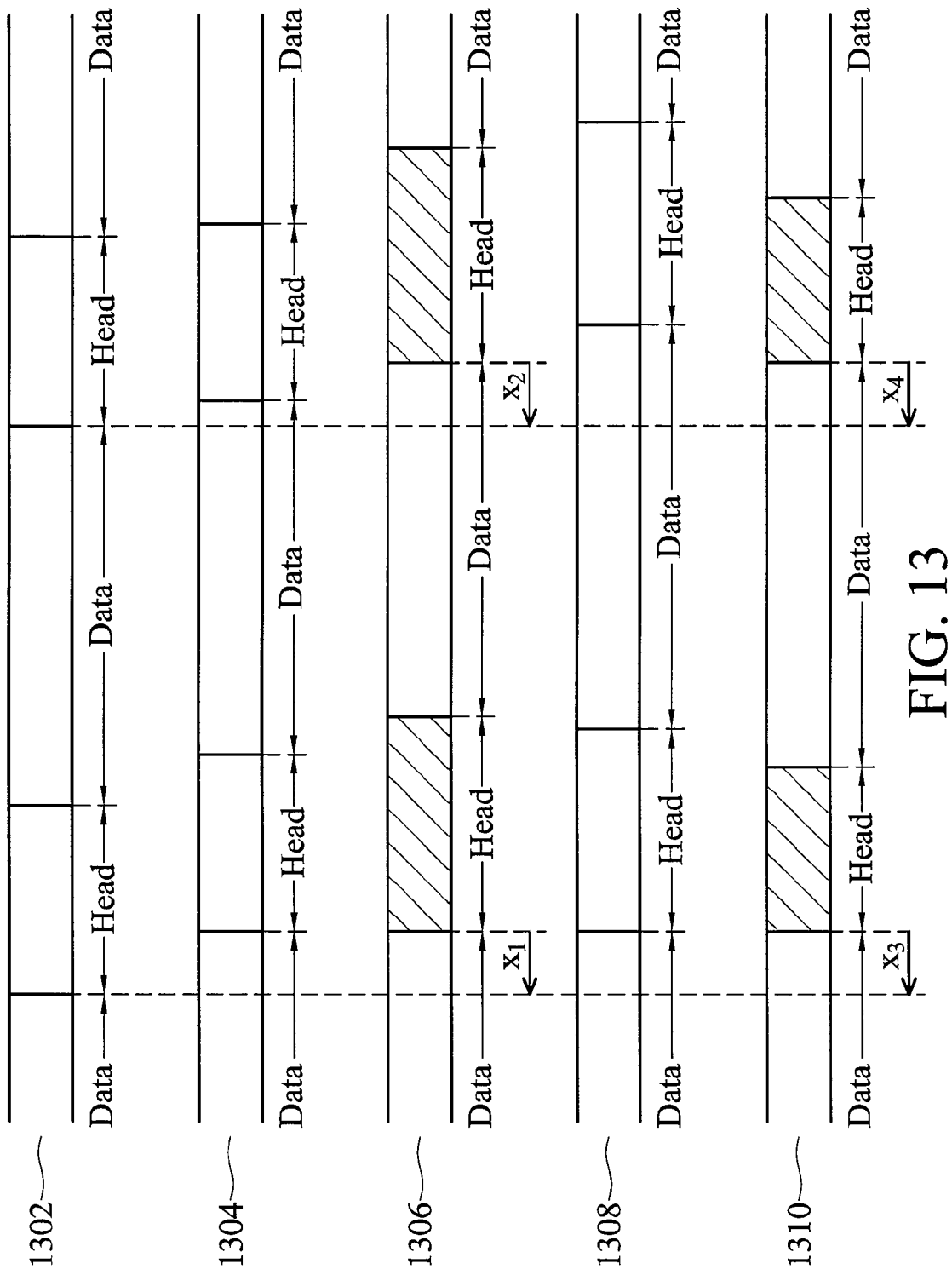
FIG. 13 illustrates length of heads adjustment of the packet signal to synchronize data transmission between the first terminal and second terminal.

FIG. 13 illustrates head length adjustment of the packet signal to synchronize data transmission between the first terminal and second terminal. First terminal 1002 uses the first clock signal to output first packet signal 1302. If the frequency of the second clock signal of second terminal 1004 is higher than the frequency of the first clock signal of the first terminal, packet signal 1304 is a simulated second packet signal. Signal synchronization device 1006 increases length of head of second packet signal 1304 to generate new second packet signal 1306 to make phase differences x1 and x2 have same distances. If the frequency of the second clock signal of second terminal 1004 is lower than the frequency of the first clock signal of the first terminal, packet signal 1308 is a simulated second packet signal. Signal synchronization device 1006 decreases the length of head of second packet signal 1308 to generate new second packet signal 1310 to make phase differences x3 and x4 have same distances.

Figure 14:
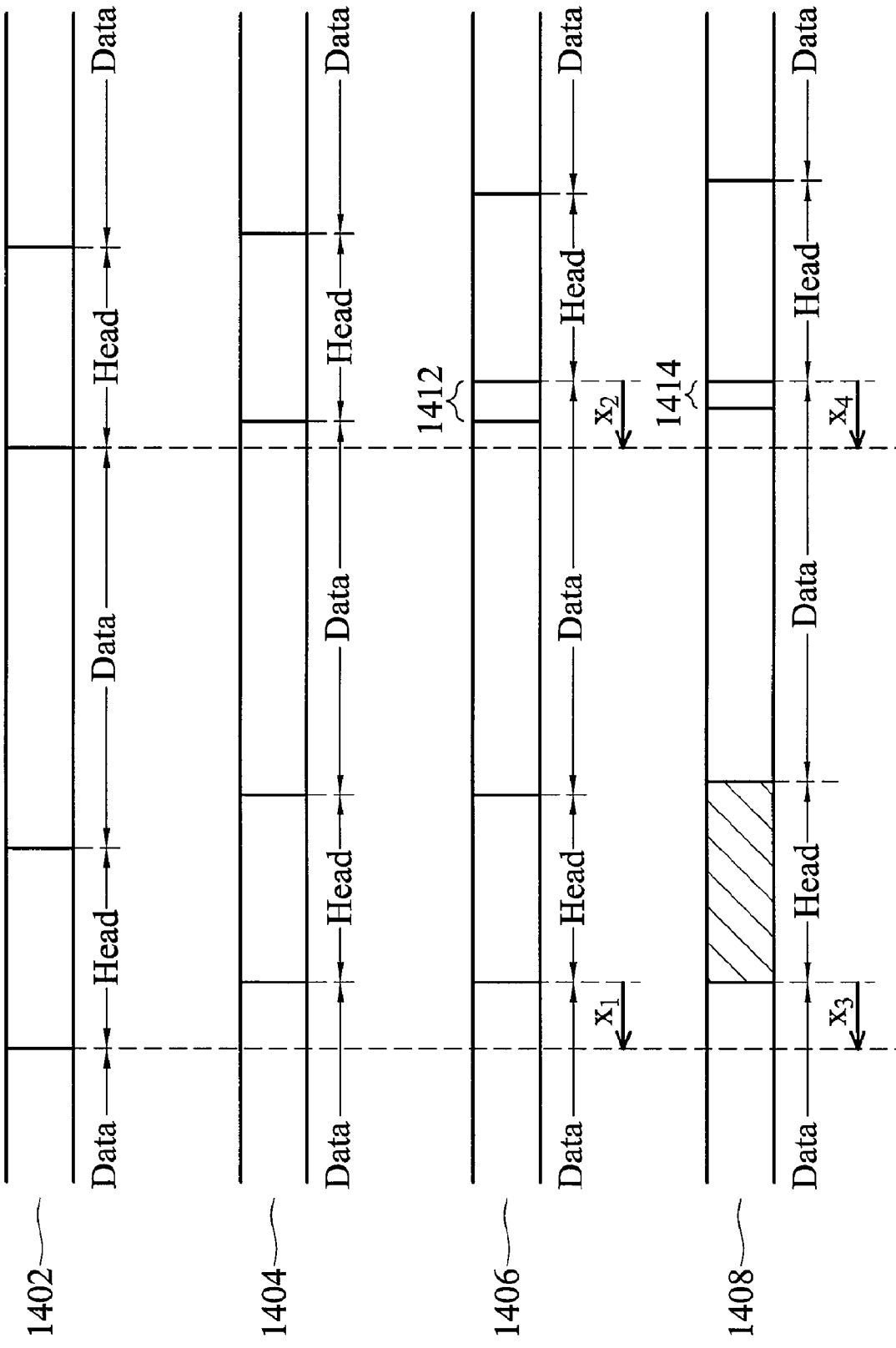
FIG. 14 illustrates length of data adjustment of the packet signal to synchronize data transmission between the first terminal and second terminal.

FIG. 14 illustrates length adjustment of data of the packet signal to synchronize data transmission between the first terminal and second terminal. First terminal 1002 uses the first clock signal to output first packet signal 1402. If the frequency of the second clock signal of second terminal 1004 is higher than the frequency of the first clock signal of the first terminal, packet signal 1404 is a simulated second packet signal. Signal synchronization device 1006 adds dummy data 1412 to the end of data of second packet signal 1404 to generate new second packet signal 1406 to make phase differences x1 and x2 have same distances. According to another embodiment of the invention, new second packet signal 1408 is generated to make phase differences x3 and x4 have same distances by appropriately adjusting lengths of heads of second packet signal 1404 and adding dummy data 1414 to the end of data of second packet signal 1404.

Figure 15:
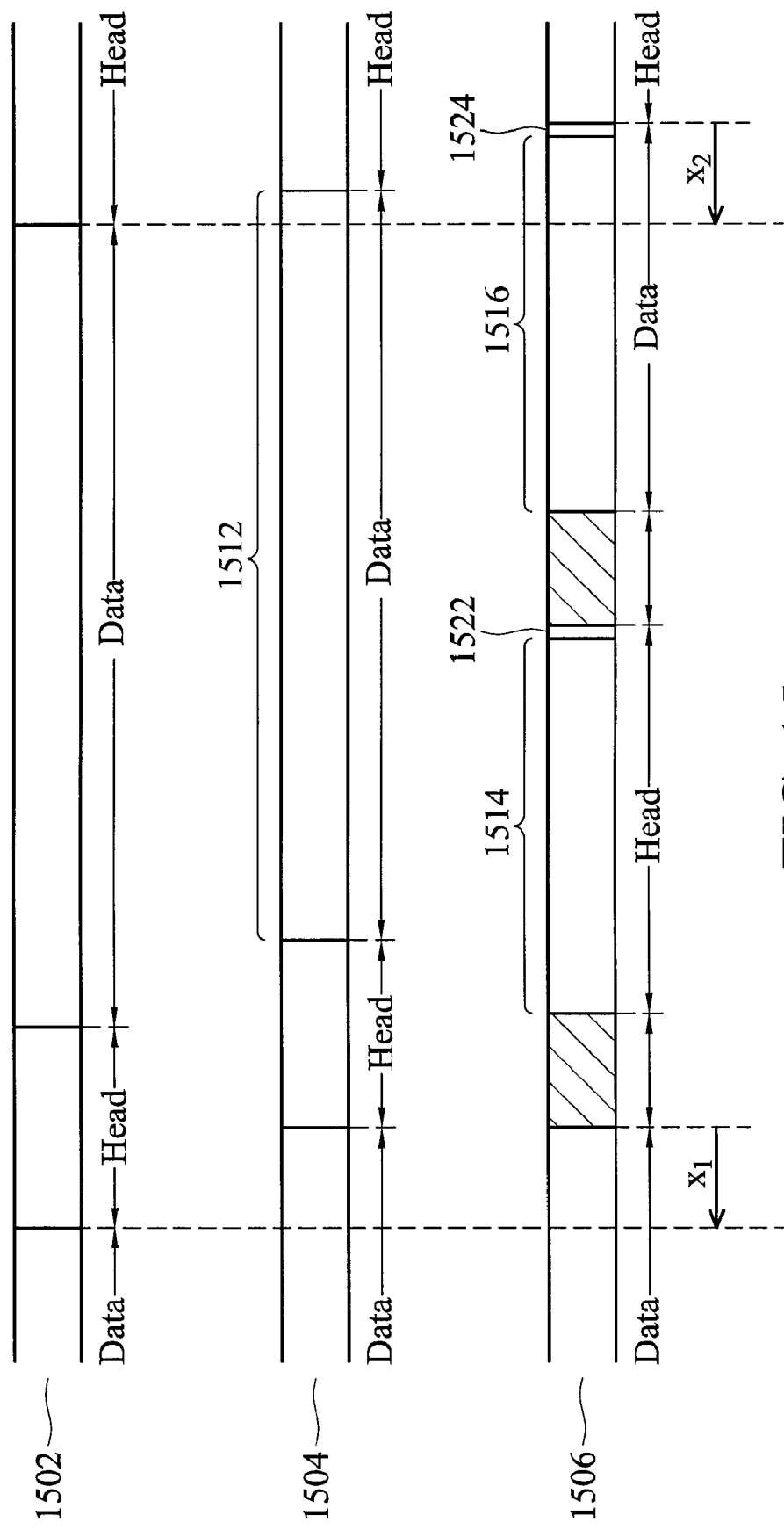
FIG. 15 illustrates division of data of the packet signal to synchronize data transmission between the first terminal and second terminal.

FIG. 15 illustrates data division of data of the packet signal to synchronize data transmission between the first terminal and second terminal. First terminal 1002 uses the first clock signal to output first packet signal 1502. If the frequency of the second clock signal of second terminal 1004 is higher than the frequency of the first clock signal of the first terminal, packet signal 1504 is a simulated second packet signal. Signal synchronization device 1006 divides data 1512 of second packet signal 1504 into new data 1514 and 1516. New second packet signal 1506 is generated to normalize distances of phase differences x1 and x2 by appropriately adjusting lengths of heads of second packet signal 1504 and adding dummy data 1522 and 1524 to the end of data 1514 and 1516.

Figure 16:
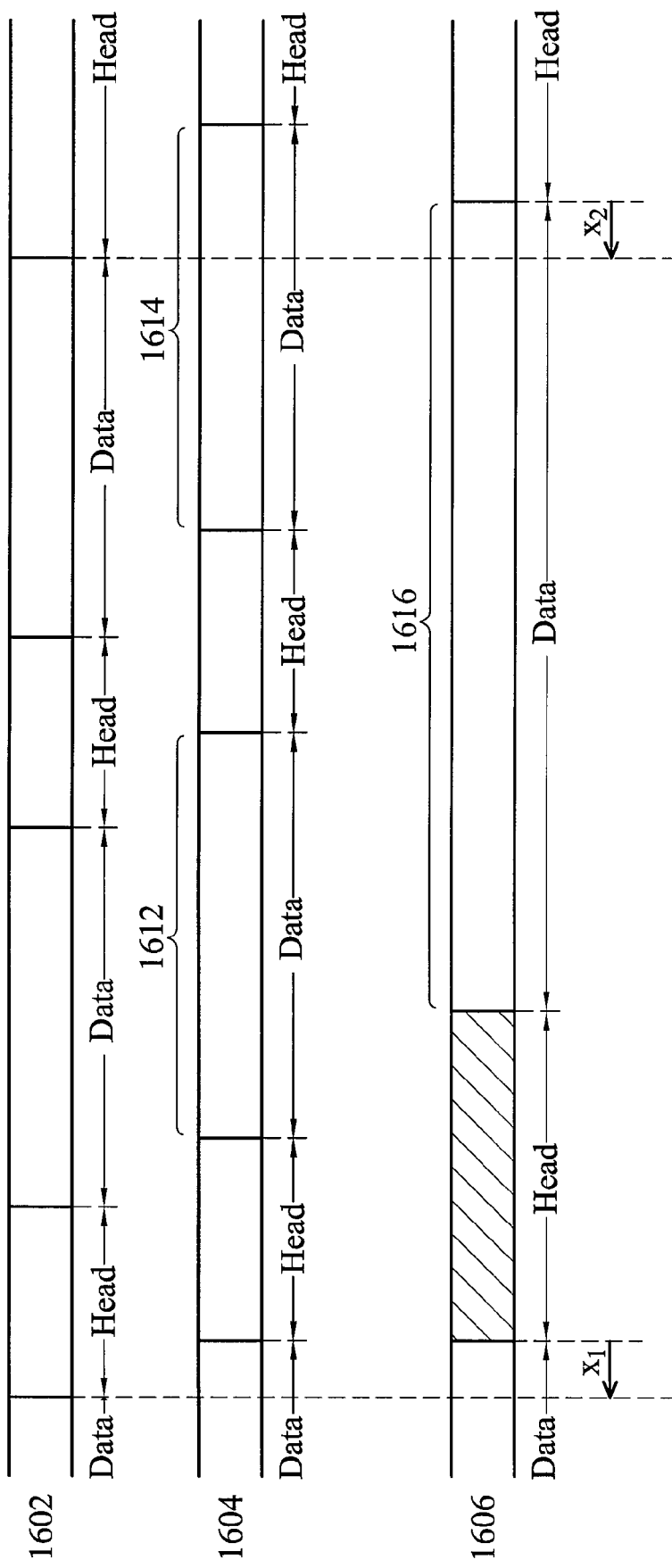
FIG. 16 illustrates integration of data of the packet signal to synchronize data transmission between the first terminal and second terminal.

FIG. 16 illustrates data integration of the packet signal to synchronize data transmission between the first terminal and second terminal. First terminal 1002 uses the first clock signal to output first packet signal 1602. If the frequency of the second clock signal of second terminal 1004 is lower than the frequency of the first clock signal of the first terminal, packet signal 1604 is a simulated second packet signal. Signal synchronization device 1006 integrates data 1612 and 1614 of second packet signal 1604 to form new data 1616. New second packet signal 1606 is generated to make phase differences x1 and x2 have same distances by appropriately adjusting length of heads of second packet signal 1604.

Figure 17:
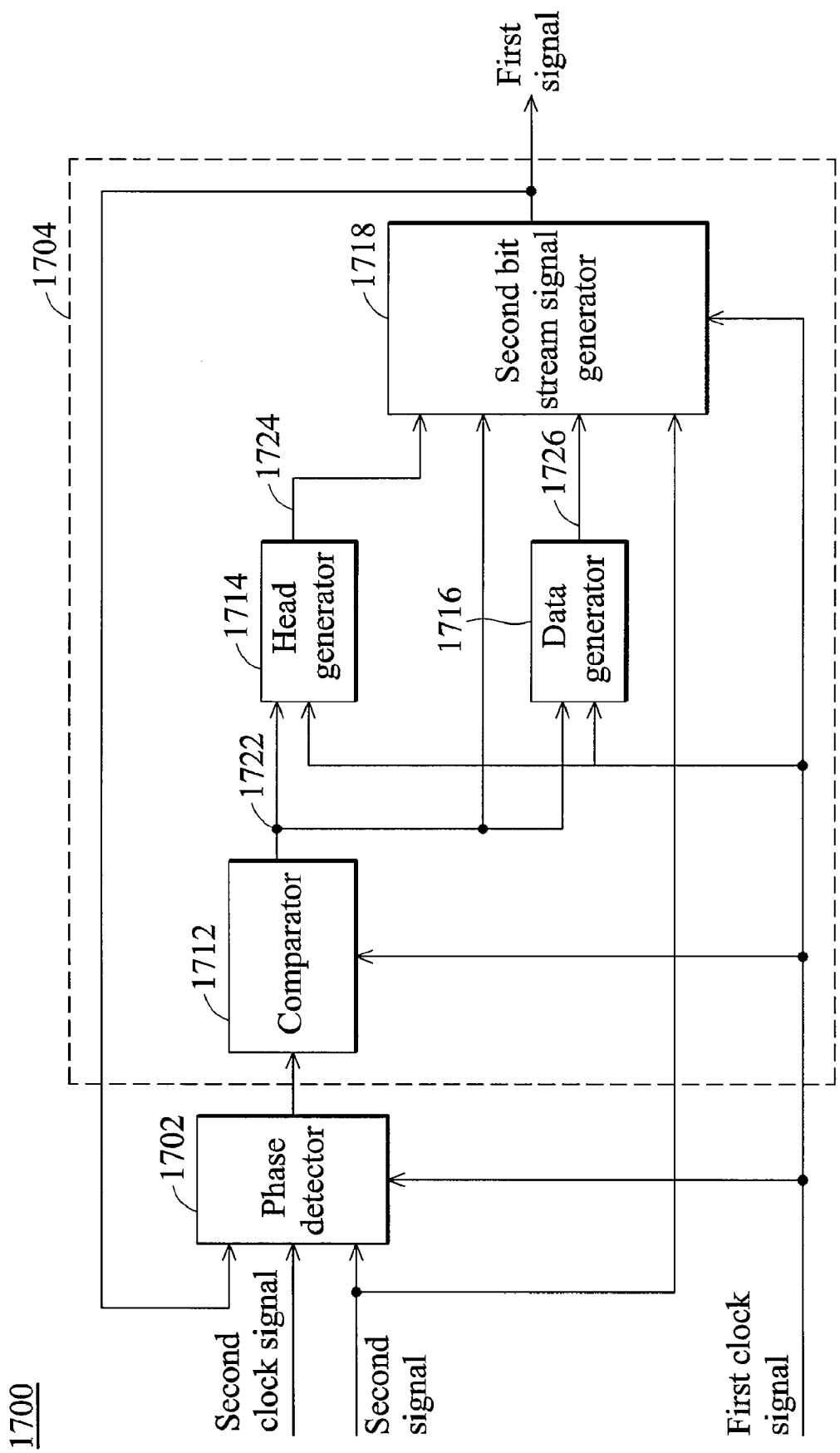
FIG. 17 shows a signal synchronization device according to an embodiment of the invention.

FIG. 17 shows a signal synchronization device according to an embodiment of the invention. Signal synchronization device 1700 comprises phase detector 1702 and a bit stream signal generator 1704. Phase detector 1702 inputs the phase difference between the first bit stream signal and second bit stream signal into comparator 1712 and parameter signal 1722 is generated, comprising information of adjustments of the second bit stream signal. Head generator 1714 and data generator 1716 respectively provide adjusting signals 1724 and 1726 to second bit stream signal generator 1718 according to parameter signal 1722. Second bit stream generator 1718 controls the length of the second head and of the second data according to adjusting signals 1724 and 1726 such that second bit stream generator 1718 can provide the second bit stream signal synchronizing with the first bit stream signal to the second terminal.

Figure 18:
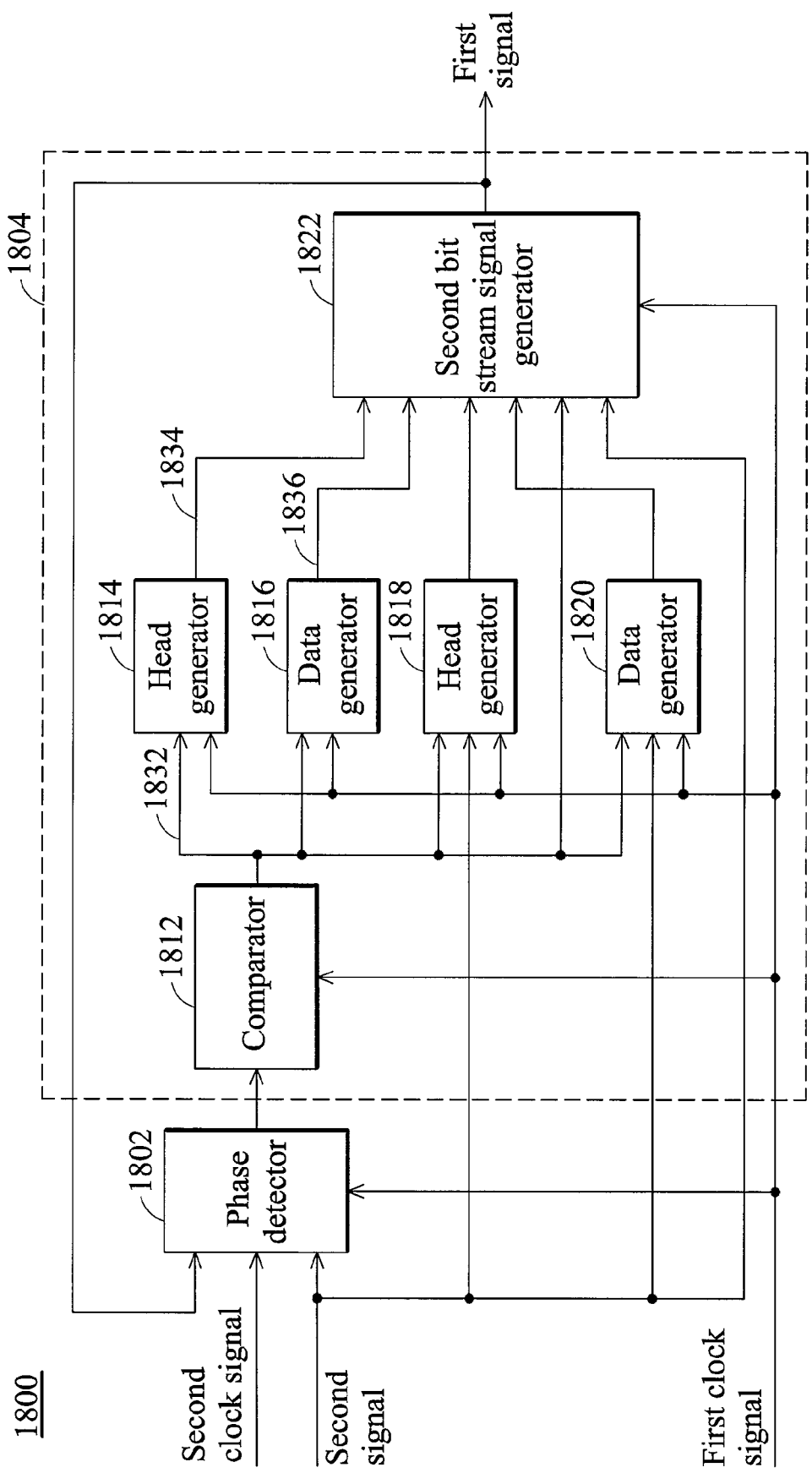
FIG. 18 shows a signal synchronization device according to another embodiment of the invention.

FIG. 18 shows a signal synchronization device according to another embodiment of the invention. Signal synchronization device 1800 comprises phase detector 1802 and a bit stream signal generator 1804. Phase detector 1802 inputs the phase difference between the first bit stream signal and second bit stream signal into comparator 1812 and parameter signal 1832 is generated. Parameter signal 1832 can decide the operation of data divider 1818 and data integrator 1820 and comprise the information of adjustments of the second bit stream signal. If the receiving speed of the second terminal exceeds the output speed of the first terminal, data divider 1818 divides the second data into several data parts. If the receiving speed of the second terminal is lower than the output speed of the first terminal, data integrator 1820 integrates the several data parts into a single part. Head generator 1814 and data generator 1816 respectively provide adjusting signals 1834 and 1836 to second bit stream signal generator 1822 according to parameter signal 1832. Second bit stream generator 1822 controls the length of the second head and of the second data according to adjusting signals 1834 and 1836 such that second bit stream generator 1822 can provide the second bit stream signal synchronizing with the first bit stream signal to the second terminal.

Figure 19:
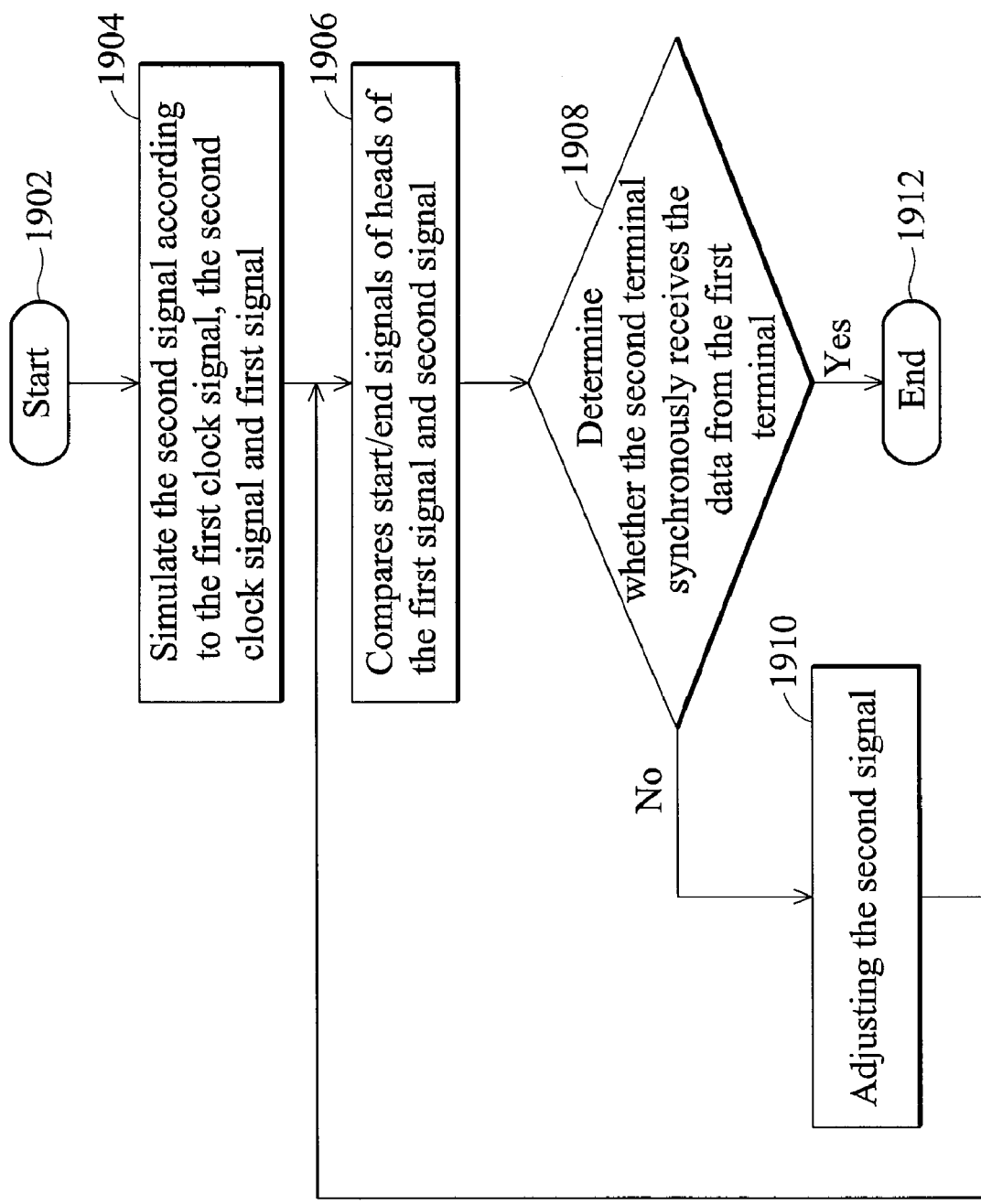
FIG. 19 shows a flowchart to illustrate that the second terminal synchronously receives data from the first terminal.

FIG. 19 shows a flowchart to illustrate that the second terminal synchronously receives data from the first terminal. The clocks of the first terminal and of the second terminal are respectively the first clock signal and second clock signal and the signal output by the first terminal is the first signal. As shown in FIG. 19, signal synchronization device 1006 receives the first clock signal, second clock signal and first signal in step 1902. In step 1904, signal synchronization device 1006 generates a simulated second signal for receiving the first signal correctly according to the first clock signal, second clock signal and first signal. In step 1906, signal synchronization device 1006 compares start/end signals of heads of the first signal and second signal to determine whether the second terminal synchronously receives the data from the first terminal (step 1908). If the second terminal cannot receive data from the first terminal synchronously, step 1910 adjusts the second signal and implements step 1906 again until step 1908 determines that the second terminal can synchronously receive the data from the first terminal. In step 1912 (End step) signal synchronization device 1006 transmits the adjusting second signal to the second terminal.

If the transmitting signal is packet signal in FIG. 19, step 1910 (adjusting the second signal) comprises adjusting length of heads and length of data of the packet signal and dividing and integrating the packet signal.

The invention provides a method and a device of signal synchronization to make the first terminal and second terminal with different clock synchronously. While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A signal synchronization method, comprising:
 determining whether a receiving device is synchronized with an output signal of an output device;
 adjusting duration of signals received by the receiving device such that the receiving device is synchronized with the output signal of the output device when not synchronized, wherein the output signal of the output device comprises a first synchronous signal and a data signal;
 generating a second synchronous signal according to a second clock signal of the receiving device; and
 comparing the first synchronous signal with the second synchronous signal to determine whether the receiving device synchronously receives the output data signal

2. The signal synchronization method as claimed in claim 1, wherein the first synchronous signal comprises a first horizontal synchronous signal and a first vertical synchronous signal and the second synchronous signal comprises a second horizontal synchronous signal and a second vertical synchronous signal.

3. The signal synchronization method as claimed in claim 2, further comprising:
comparing whether the first and second vertical synchronous signals are synchronous to determine whether the receiving device is synchronized with the output signal of the output device.

4. The signal synchronization method as claimed in claim 3, further comprising:
comparing phase differences of the first and second vertical synchronous signals to determine whether the first second vertical synchronous signals are synchronous.

5. The signal synchronization method as claimed in claim 3, further comprising adjusting amounts of the second horizontal synchronous signal in duration of the second vertical synchronous signal when not synchronized.

6. The signal synchronization method as claimed in claim 5, further comprising:
increasing amounts of the second horizontal synchronous signal in duration of the second vertical synchronous signal when frequency of the second vertical synchronous signal is higher than frequency of the first vertical synchronous signal; and
decreasing amounts of the second horizontal synchronous signal in duration of the second vertical synchronous signal when frequency of the second vertical synchronous signal is lower than frequency of the first vertical synchronous signal.

7. The signal synchronization method as claimed in claim 3, further comprising:
adjusting duration of the second horizontal synchronous signal in the second vertical synchronous signal to adjust duration of the second vertical synchronous signal when not synchronized.

8. The signal synchronization method as claimed in claim 7, further comprising:
increasing duration of the second horizontal synchronous signal in duration of the second vertical synchronous signal to increase duration of the vertical synchronous signal when frequency of the second vertical synchronous signal is higher than the first vertical synchronous signal; and
decreasing duration of the second horizontal synchronous signal in duration of the second vertical synchronous signal to decrease duration of the vertical synchronous signal when frequency of the second vertical synchronous signal is lower than the first vertical synchronous signal.

9. The signal synchronization method as claimed in claim 3, further comprising adjusting amounts and duration of the second horizontal synchronous signal in the second vertical synchronous signal to adjust duration of the second vertical synchronous signal when not synchronized.

10. The signal synchronization method as claimed in claim 2, further comprising comparing the first and second horizontal synchronous signals to determine whether the receiving device is synchronized with the output signal of the output device.

11. The signal synchronization method as claimed in claim 10, further comprising adjusting data length of the output signal or adjusting duration of the second horizontal synchronous signal when not synchronized in duration of the second horizontal synchronization.

12. The signal synchronization method as claimed in claim 10, further comprising adjusting data length of the output signal in duration of the second horizontal synchronous signal or adjusting duration of the second horizontal synchronous signal when not synchronized in duration of the second horizontal synchronous signal.

13. The signal synchronization method as claimed in claim 11, further comprising:
increasing data length of the output signal when frequency of the second vertical synchronous signal is higher than frequency of the first vertical synchronous signal; and
decreasing data length of the output signal when frequency of the second vertical synchronous signal is lower than frequency of the first vertical synchronous signal.

14. The signal synchronization method as claimed in claim 1, wherein the output signal is a bit stream which carries the first synchronous signal and the data signal.

15. A signal synchronization device which enables at least one receiving device to be synchronized with at least one output device, characterized by the signal synchronization device adjusting a synchronous signal received by the receiving device according to a synchronous signal from the output device, a first clock signal from the output device, and a second clock signal from the receiving device, wherein the synchronous signal from the output device is a first synchronous signal and the synchronous signal received by the receiving device is a second synchronous signal;
wherein the signal synchronization device comprising:
a phase detector detecting the first and second clock signals from the output device and the receiving device and the first and second synchronous signals and generating a synchronous deviation signal; and
a signal generator adjusting duration of the second synchronous signal according to the synchronous deviation signal and generating the second synchronous signal according to the second clock signal.

16. The signal synchronization device as claimed in claim 15, wherein the synchronous deviation signal comprises a phase difference between the first and second synchronous signals.

17. The signal synchronization device as claimed in claim 15, wherein the first synchronous signal comprises a first horizontal synchronous signal and a first vertical synchronous signal and the second synchronous signal comprises a second horizontal synchronous signal and a second vertical synchronous signal.

18. The signal synchronization device as claimed in claim 17, wherein the phase detector detects the first and second clock signals and the first and second vertical synchronous signals and the signal synchronization device adjusts amounts or duration of the second horizontal synchronous signal in the second vertical synchronous signal.

19. The signal synchronization device as claimed in claim 18, wherein the signal generator comprises:
a comparator receiving the synchronous deviation signal and generating a parameter signal;
a Hsync generator receiving the parameter signal and generating a positive horizontal synchronous signal;
a Hsync eliminating circuit receiving the parameter signal and generating a negative horizontal synchronous signal;
a Hsync duration counter receiving the parameter signal and generating a count result; and
a second Vsync generator receiving the parameter signal, the positive horizontal synchronous signal, the negative horizontal synchronous signal, and the count result to generate the second vertical synchronous signal.

20. The signal synchronization device as claimed in claim 17, wherein the phase detector detects the first and second clock signals and the first and second horizontal synchronous signals and the signal synchronization device adjusts data length of an output signal of the output device or duration of the second horizontal synchronous signal in duration of the second horizontal synchronous signal.

21. The signal synchronization device as claimed in claim 20, wherein the signal generator comprises:
   a comparator receiving the synchronous deviation signal and generating a parameter signal;
   a dummy data generator receiving the parameter signal and generating a positive data signal;
   a data eliminating circuit receiving the parameter signal and generating a negative data signal;
   a data buffer receiving the parameter signal, the output signal, the positive data signal, and the negative data signal; and
   a second Hsync generator receiving the parameter signal, the positive data signal, and the negative data signal and generating the second horizontal synchronous signal.

22. A signal synchronization method for a second terminal receiving an output signal from a first terminal, comprising:
   determining whether the second terminal receives the output signal from the first terminal synchronously; and
   adjusting data length of receiving signal of the second terminal to make the second terminal receive the output signal from the first terminal synchronously, wherein the first terminal outputs a first signal using a first clock signal and wherein determination of whether the second terminal receives the output signal from the first terminal synchronously further comprises:
   generating a second signal for the second terminal according to the first clock signal, the first signal and a second clock signal used by the second terminal; and
   comparing the first and second signals to determine whether the second terminal receive the first signal from the first terminal synchronously.

23. The signal synchronization method as claimed in claim 22, wherein generation of a second signal according to the first clock signal, the first signal and the second clock signal further comprises simulating the second clock reading the first signal correctly to generate the second signal.

24. The signal synchronization method as claimed in claim 23, further comprising determining whether the second terminal can receive the first signal synchronously according to variations of phase differences of the first signal and the second signal.

25. The signal synchronization method as claimed in claim 24, further comprising:
   comparing start/end signals of heads of the first signal and second signal; and
   deciding a receiving speed of the second terminal faster than an output speed of the first terminal when start/end signals of heads of the second signal moves faster than start/end signals of heads of the first signal and vice versa.

26. The signal synchronization method as claimed in claim 22, wherein a signal transmitted between the first terminal and the second terminal is a bit stream signal.

27. A signal synchronization method for a second terminal receiving an output signal from a first terminal, comprising:
   determining whether the second terminal receives the output signal from the first terminal synchronously;
   adjusting data length of receiving signal of the second terminal to make the second terminal receive the output signal from the first terminal synchronously, wherein a signal transmitted between the first terminal and the second terminal is a packet signal; and
   adjusting length of heads of the packet signal when the second terminal cannot receive the output signal from the first terminal synchronously.

28. A signal synchronization method for a second terminal receiving an output signal from a first terminal, comprising:
   determining whether the second terminal receives the output signal from the first terminal synchronously;
   adjusting data length of receiving signal of the second terminal to make the second terminal receive the output signal from the first terminal synchronously, wherein a signal transmitted between the first terminal and the second terminal is a packet signal; and
   adjusting length of data of the packet signal when the second terminal cannot receive the output signal from the first terminal synchronously.

29. A signal synchronization method for a second terminal receiving an output signal from a first terminal, comprising:
   determining whether the second terminal receives the output signal from the first terminal synchronously;
   adjusting data length of receiving signal of the second terminal to make the second terminal receive the output signal from the first terminal synchronously, wherein a signal transmitted between the first terminal and the second terminal is a packet signal; and
   dividing or integrating the packet signal when the second terminal cannot receive the output signal from the first terminal synchronously.

30. A signal synchronization method for a second terminal receiving an output signal from a first terminal, comprising:
   determining whether the second terminal receives the output signal from the first terminal synchronously;
   adjusting data length of receiving signal of the second terminal to make the second terminal receive the output signal from the first terminal synchronously, wherein a signal transmitted between the first terminal and the second terminal is a packet signal;
   increasing length of heads of the packet signal when the receiving speed of the second terminal exceeds the output speed of the first terminal; and
   decreasing length of heads of the packet signal when the receiving speed of the second terminal is lower than the output speed of the first terminal.

31. The signal synchronization method as claimed in claim 28, further comprising:
   increasing length of data of the packet signal when the receiving speed of the second terminal exceeds the output speed of the first terminal; and
   decreasing length of data of the packet signal when the receiving speed of the second terminal is lower than the output speed of the first terminal.

32. The signal synchronization method as claimed in claim 29, further comprising:
   dividing the packet signal into two parts when the receiving speed of the second terminal exceeds the output speed of the first terminal; and
   integrating the packet signal when the receiving speed of the second terminal exceeds the output speed of the first terminal.

33. The signal synchronization method as claimed in claim 32, further comprising:
   determining length of data of the packet signal;
   inserting dummy data into the packet signal when the data is too short after dividing; and
   deleting dummy data of the packet signal when the data is too long after integrating.

* * * * *